(12) United States Patent
Schaefer

(10) Patent No.: US 12,051,477 B2
(45) Date of Patent: Jul. 30, 2024

(54) INDICATING A STATUS OF A MEMORY BUILT-IN SELF-TEST FOR MULTIPLE MEMORY DEVICE RANKS

(71) Applicant: Micron Technology, Inc., Boise, ID (US)

(72) Inventor: Scott E. Schaefer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 173 days.

(21) Appl. No.: 17/815,747

(22) Filed: Jul. 28, 2022

(65) Prior Publication Data

US 2024/0047004 A1 Feb. 8, 2024

(51) Int. Cl.
*G11C 29/46* (2006.01)
*G11C 7/10* (2006.01)
*G11C 29/12* (2006.01)

(52) U.S. Cl.
CPC ............ *G11C 29/46* (2013.01); *G11C 7/1063* (2013.01); *G11C 29/1201* (2013.01)

(58) Field of Classification Search
CPC ...................................................... G11C 29/46

USPC ......................................................... 365/201
See application file for complete search history.

(56) References Cited

U.S. PATENT DOCUMENTS

2019/0049513 A1* 2/2019 Azam ................ G01R 31/3177
2021/0141741 A1* 5/2021 Meier .................... G11C 17/16

* cited by examiner

*Primary Examiner* — Muna A Techane
(74) *Attorney, Agent, or Firm* — Harrity & Harrity, LLP

(57) ABSTRACT

Implementations described herein relate to indicating a status of the memory built-in self-test for multiple memory device ranks. A memory device may read one or more bits, associated with a memory built-in self-test, that are stored in a mode register of the memory device. The memory device may identify a first data mask inversion (DMI) bit of the memory device that is associated with a first rank of the memory device and a second DMI bit of the memory device that is associated with a second rank of the memory device. The memory device may set the first DMI bit to a first value based on determining to perform the memory built-in self-test for the first rank of the memory device. The memory device may perform the memory built-in self-test for the first rank of the memory device based on setting the first DMI bit to the first value.

25 Claims, 13 Drawing Sheets

INDICATING A STATUS OF A MEMORY BUILT-IN SELF-TEST FOR MULTIPLE MEMORY DEVICE RANKS

TECHNICAL FIELD

The present disclosure generally relates to memory devices, memory device operations, and, for example, to indicating a status of a memory built-in self-test for multiple memory device ranks.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

DETAILED DESCRIPTION

Figure 1:
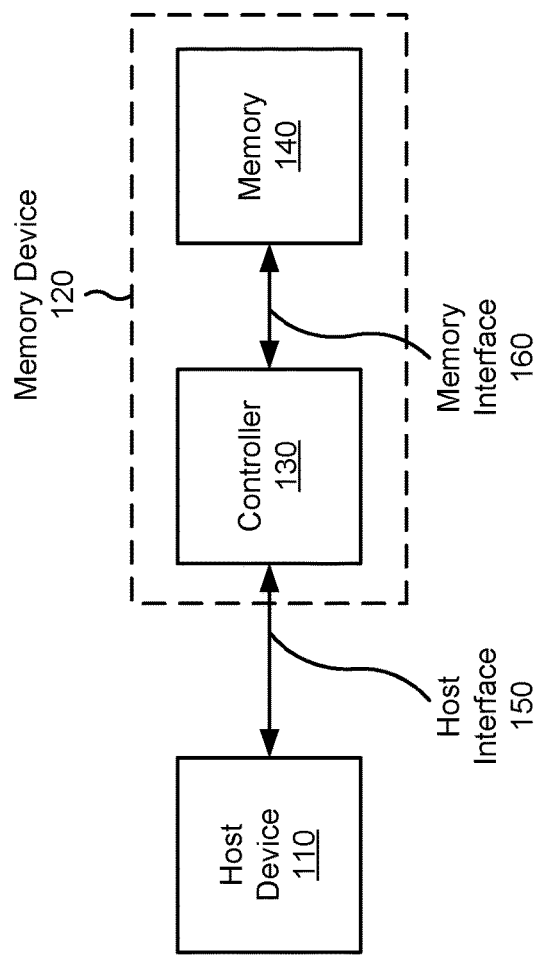
FIG. 1 is a diagram illustrating an example system capable of performing a memory built-in self-test and indicating a status of the memory built-in self-test for multiple memory device ranks.

A memory device, such as a DRAM memory device, may include test circuitry configured to perform a memory built-in self-test (MBIST or mBIST). The test circuitry may execute a test procedure to test for and/or repair memory errors. For example, the test circuitry may employ a checkerboard algorithm, a march algorithm, or a combination of march and checkerboard algorithms, among other examples, to test memory cells of a memory array for errors. The memory device may report and/or repair the errors to improve functionality and reliability of the memory device.

In many cases, an MBIST may be performed as part of a manufacturing or production process, where an entire memory array is (or multiple memory arrays are) tested during a single execution of an MBIST algorithm. This is sufficient to repair errors when the memory device is integrated into a memory module by the manufacturer, such as by soldering the memory device to a printed circuit board. The soldering process can often introduce errors, such as single-bit errors and/or variable retention errors, to memory cells due to high temperatures associated with soldering. If the manufacturer of the memory device performs the soldering and/or integration of the memory device and a memory module, then the manufacturer can trigger the memory device to perform the MBIST as part of the manufacturing process, when the amount of time it takes to perform the MBIST is not critical (e.g., longer test times are acceptable).

In some cases, a party other than the manufacturer, such as a customer who obtains the memory device, may solder or otherwise integrate the memory device into a memory system (e.g., an embedded memory system), which may introduce memory errors after the memory device has left the control of the manufacturer. In these cases, the customer can trigger the memory device to perform the MBIST after integrating the memory device in a memory system, when the amount of time it takes to perform the MBIST is not critical (e.g., longer test times are acceptable). However, it may be desirable to perform the MBIST after the memory device has left the control of the customer, such as when the memory device is in control of an end user. As an example, it may be desirable to periodically or occasionally test a memory device that is embedded in an automotive system when the automotive system is in control of an end user, such as to improve reliability of the memory device and improve operation of the automotive system (e.g., a vehicle). This may be referred to as "in-the-field" testing.

In some cases, a control signal may be used to indicate one or more functions to be applied to data during a standard memory operation of the memory device. For example, a bit that is associated with a data mask inversion (DMI) pin of the memory device (e.g., a DMI bit) may be used to indicate whether a data mask inversion function (and/or other functions described herein) is to be applied to the data associated with the standard memory operation. In some cases, the memory device may have multiple DMI pins. For example, a first DMI pin (and corresponding first DMI bit) of the memory device may be associated with a first portion of the memory device, and a second DMI pin (and corresponding second DMI bit) of the memory device may be associated with a second portion of the memory device. In some cases, the first portion of the memory device may be a lower memory portion, and the second portion of the memory device may be an upper memory portion that is electrically stacked on the lower memory portion. The lower memory portion (which may include one or more lower memory sections or die) may be referred to as a first rank of the memory device, and the upper memory portion (which may include one or more lower memory sections or die) may be referred to as a second rank of the memory device. The first rank of the memory device and the second rank of the memory device may share certain pins, such as all pins except for the DMI pin and a chip select pin.

In some cases, it may be beneficial to enable the memory device to indicate, to the host device, whether the memory device is currently performing an MBIST or is not currently performing an MBIST. For example, the host device may be configured not to interrupt the MBIST while the memory device is currently performing the MBIST. However, adding a new control signal or a new pin to the memory device may require the memory device to be reconfigured. Additionally, the new control signal or the new pin may not be required or may not be capable of being used during the standard memory operations of the memory device, and may result in the memory device not conforming to industry standards. In some cases, using the DMI pin to indicate the status of the MBIST (while the MBIST is enabled by the host device) may reduce the number of pins that are needed. However, when the memory device is configured with multiple ranks, the MBIST may only be performed on a single rank at a given time. For example, the memory device may perform the MBIST on the first rank of the memory device or the second rank of the memory device, but may not perform the MBIST on the first rank of the memory device and the second rank of the memory device simultaneously. This may cause the MBIST for the memory device to take longer, such as twice as long since the memory device may need to perform the MBIST separately for each rank of the memory device.

Some techniques described herein enable the memory device to use one or more DMI bits to indicate whether the memory device is currently performing the MBIST or is not currently performing the MBIST for a particular rank of the memory device. In some implementations, the memory device may use a first DMI bit to indicate a status of the MBIST for a first rank of the memory device and may use a second DMI bit to indicate a status of the MBIST for the second rank of the memory device. A first value (e.g., "0") for the first DMI bit may indicate that the memory device is performing the MBIST for the first rank of the memory device, and a second value (e.g., "1") for the first DMI bit may indicate that the memory device is not performing the MBIST for the first rank of the memory device. In contrast, the first value (e.g., "0") for the second DMI bit may indicate that the memory device is not performing the MBIST for the second rank of the memory device, while the second value (e.g., "1") for the second DMI bit may indicate that the memory device is performing the MBIST for the second rank of the memory device. By using different DMI bits and different DMI bit values to indicate the MBIST status, the memory device may be able to simultaneously perform the MBIST for the first rank of the memory device and the second rank of the memory device. This may improve the performance and reliability of the memory device while reducing the number of bits that are needed to indicate and determine the status of the MBIST.

FIG. 1 is a diagram illustrating an example system 100 capable of memory section selection for a memory built-in self-test. The system 100 may include one or more devices, apparatuses, and/or components for performing operations described herein (e.g., for memory section selection for a memory built-in self-test). For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component. In some implementations, the host device 110 may be or may be included in an automotive system, such as an automobile or a system thereof (e.g., a safety system, a driving system, a navigation system, a steering system, or the like).

The memory device 120 may be any electronic device configured to store data in memory. In some implementations, the memory device 120 may be an electronic device configured to store data temporarily in volatile memory. For example, the memory device 120 may be a random-access memory (RAM) device, such as a dynamic RAM (DRAM) device or a static RAM (SRAM) device. In this case, the memory 140 may include volatile memory that requires power to maintain stored data and that loses stored data after the memory device 120 is powered off. For example, the memory 140 may include one or more latches and/or RAM, such as DRAM and/or SRAM. In some implementations, the memory 140 may include non-volatile memory configured to maintain stored data after the memory device 120 is powered off, such as NAND memory or NOR memory. For example, the non-volatile memory may store persistent firmware or other instructions for execution by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components.

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a Universal Serial Bus (USB) interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the host device 110 may select one or more memory sections, of the memory device 120, for an MBIST. Additionally, or alternatively, the host device 110 may trigger the MBIST and/or control execution of the MBIST on the selected one or more memory sections. The memory device 120 (e.g., the controller 130) may perform the MBIST on the one or more memory sections (e.g., in accordance with instructions provided by the host device 110), such as to test one or more sections of the memory 140 (e.g., volatile memory).

As indicated above, FIG. 1 is provided as an example. Other examples may differ from what is described with regard to FIG. 1.

Figure 2:
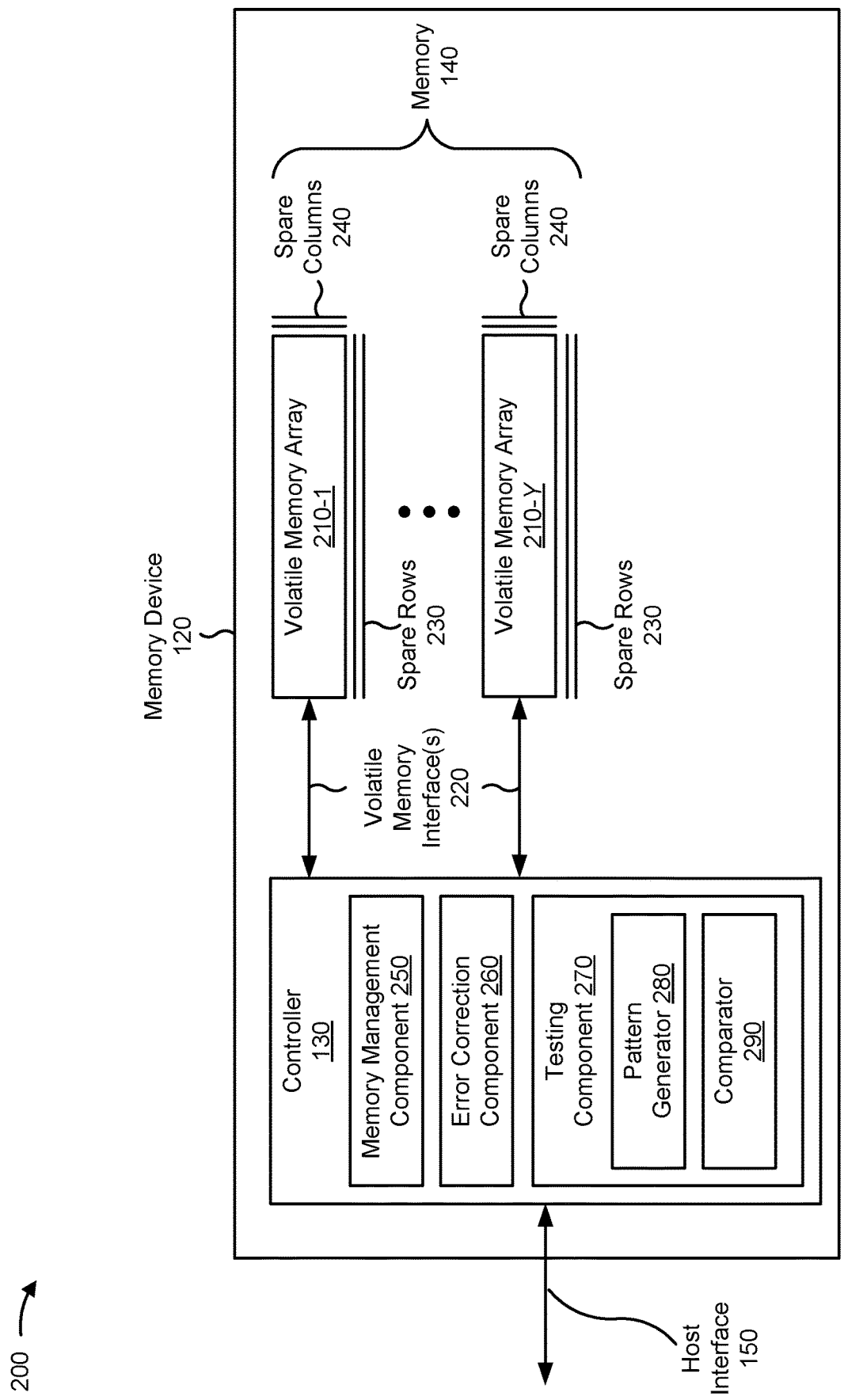
FIG. 2 is a diagram of example components included in a memory device.

FIG. 2 is a diagram of example components included in the memory device 120 of FIG. 1. As described above in connection with FIG. 1, the memory device 120 may include a controller 130 and memory 140. As shown in FIG. 2, the memory 140 may include one or more volatile memory arrays 210 (shown as 210-1 through 210-Y), such as one or more DRAM arrays. In some implementations, the memory device 120 include multiple (e.g., a plurality of) volatile memory arrays 210. The controller 130 may transmit signals to and receive signals from a volatile memory array 210 using a volatile memory interface 220. In some implementations, the controller 130 may use a separate volatile memory interface 220 to access each volatile memory array 210.

As shown, the memory 140 may include spare rows 230 (sometimes called "spare memory rows") and/or spare columns 240 (sometimes called "spare memory columns"). When the memory device 120 is manufactured, the spare rows 230 and spare columns 240 may not be used to store data and/or may be inaccessible to the host device 110, such as for storage of host data. If the memory device 120 is tested and a defective row (or defective column) of memory is detected, then the defective row (or defective column) may be disconnected from the rest of the memory array and may be replaced by a spare row (or a spare column). For example, the controller 130 may trigger a programmable fuse to be blown to disconnect the defective row (or defective column) from the memory array. The controller 130 may store logic that replaces the defective row (or defective column) with a replacement row (or replacement column), such as in a memory mapping table. The term "replacement row" (or "replacement column") refers to a spare row (or spare column) that has replaced a defective row (or defective column) in the memory array. In some cases, a memory reconfiguration technique other than blowing a fuse may be used to replace defective memory cells with spare memory cells.

Although FIG. 2 shows each volatile memory array 210 having its own corresponding spare rows and spare columns (sometimes called "local" spare rows and "local" spare columns), other configurations are possible. For example, the memory device 120 may include spare rows that can be configured for use in any volatile memory array 210 (sometimes called "global" spare rows) and/or may include spare columns that can be configured for use in any volatile memory array 210 (sometimes called "global" spare columns). The memory device 120 may include any combination of local spare rows, local spare columns, global spare rows, and/or global spare columns.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250, an error correction component 260, and/or a testing component 270. In some implementations, one or more of these components are implemented as one or more instructions (e.g., firmware) executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The error correction component 260 may be configured to detect and/or correct errors associated with the memory device 120. For example, the error correction component 260 may be configured to detect and/or correct an error associated with writing data to or reading data from one or more memory cells of a memory array, such as a single-bit error (SBE) or a multi-bit error (MBE).

The testing component 270 may be configured to perform an MBIST on the volatile memory arrays 210. For example, the testing component 270 may obtain and/or store instructions for execution of the MBIST. Additionally, or alternatively, the testing component 270 may be configured to repair detected errors, such as by performing a post-package repair (PPR) procedure (sometimes called a memory post-package repair, or MPPR). As shown, the testing component 270 may include a pattern generator 280 and a comparator 290. The pattern generator 280 may generate test patterns to be applied to one or more volatile memory arrays 210. The comparator 290 may read test sequences from one or more volatile memory arrays 210 and compare those test sequences to expected test sequences. Based on the comparison, the comparator 290 may determine whether the volatile memory array 210 passed or failed the MBIST and/or may determine a location of the failure.

Figure 9A:
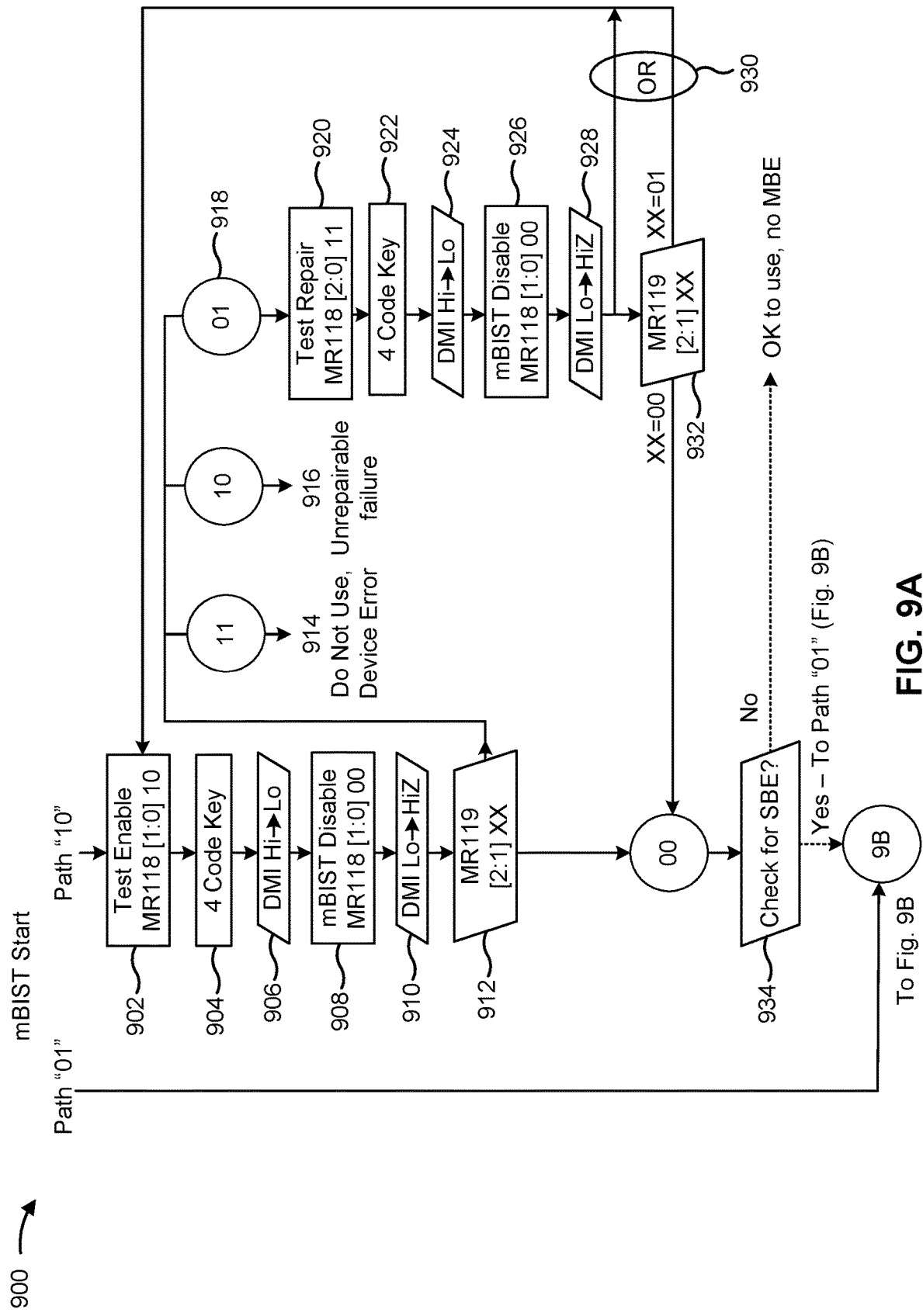
FIGS. 9A-9B are diagrams illustrating an example of a process flow for performing a memory built-in self-test.
Figure 9B:
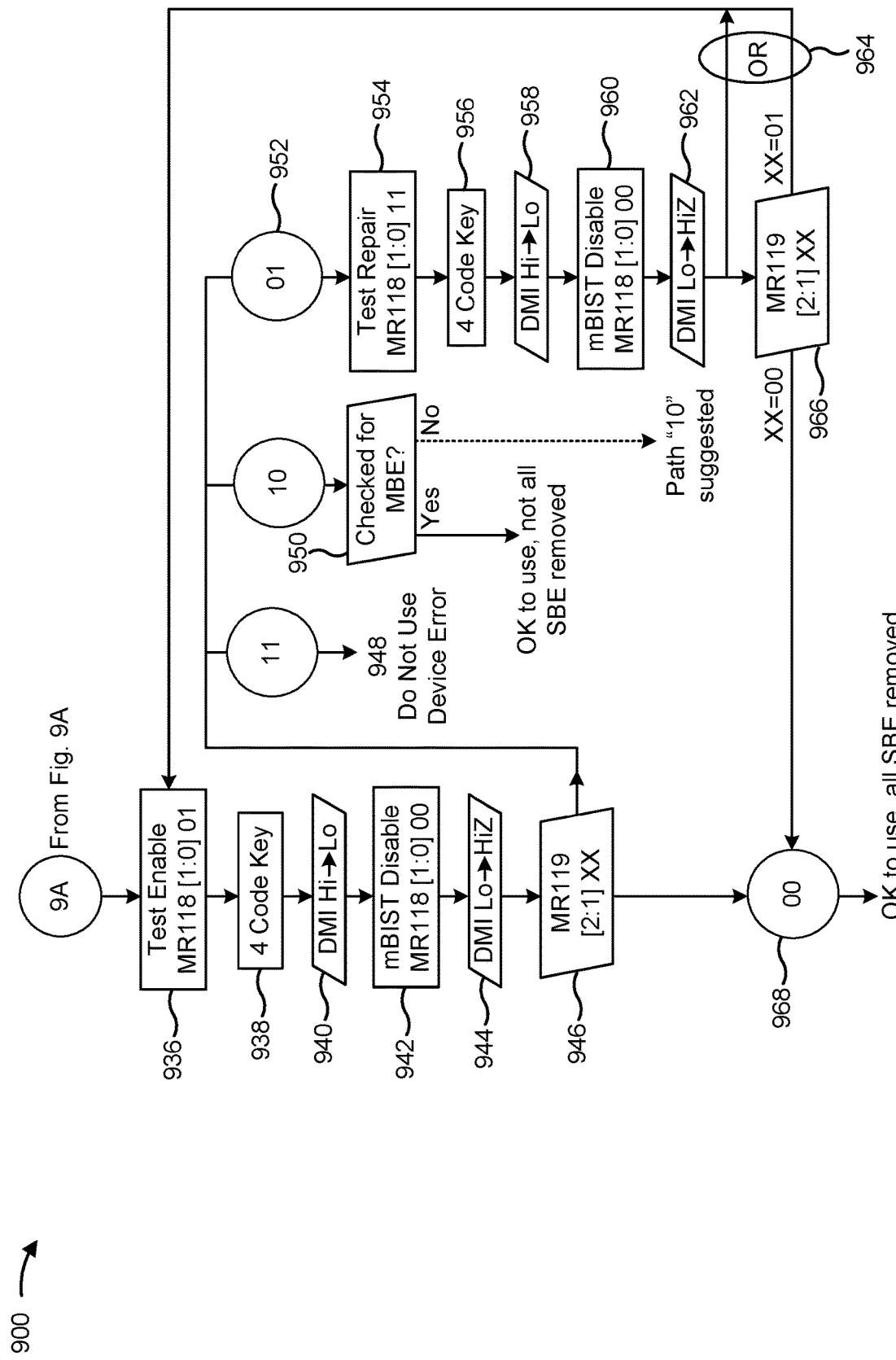
Figure 10:
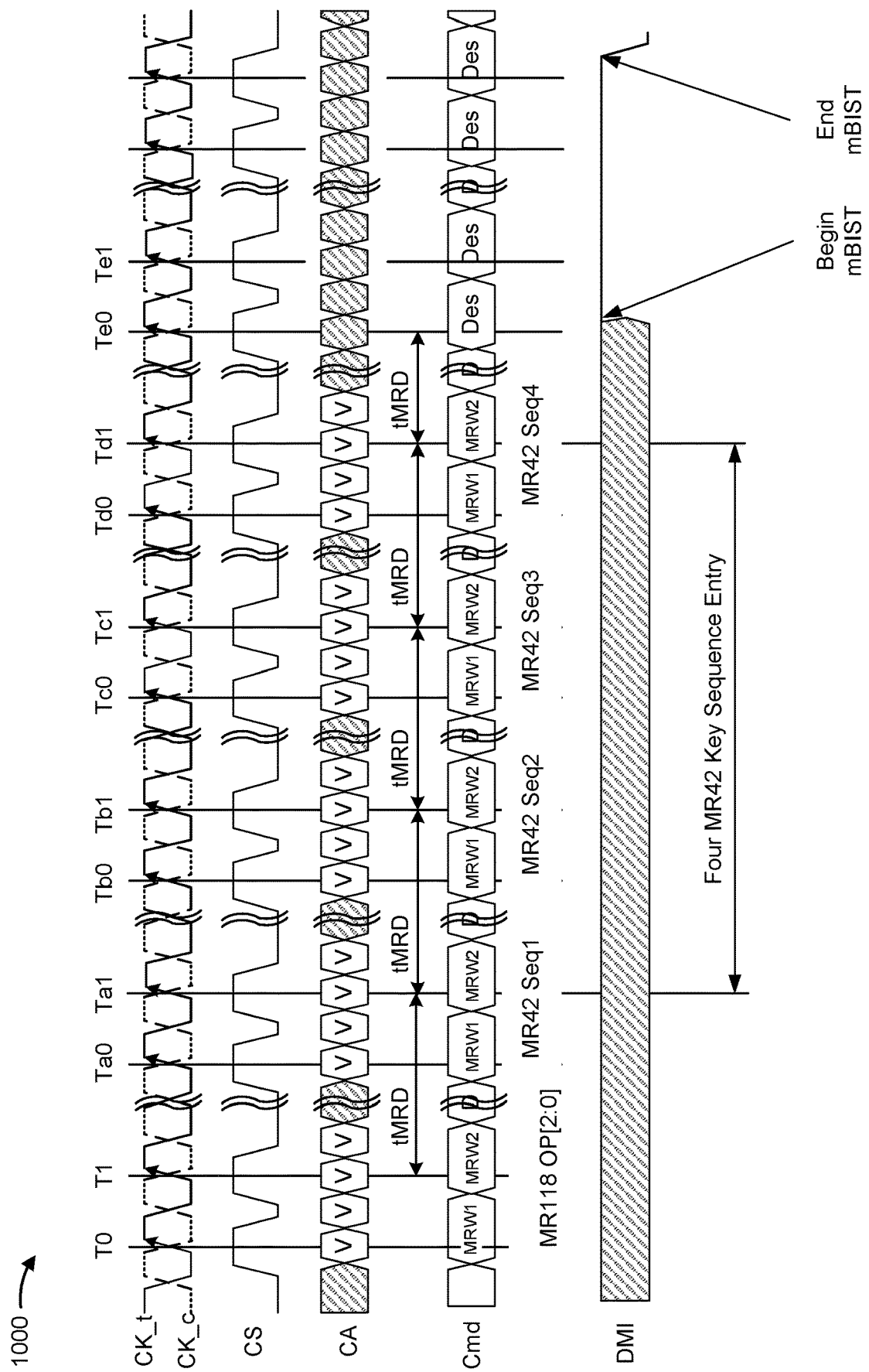
FIG. 10 is an example timing diagram associated with performing a memory built-in self-test.
Figure 11:
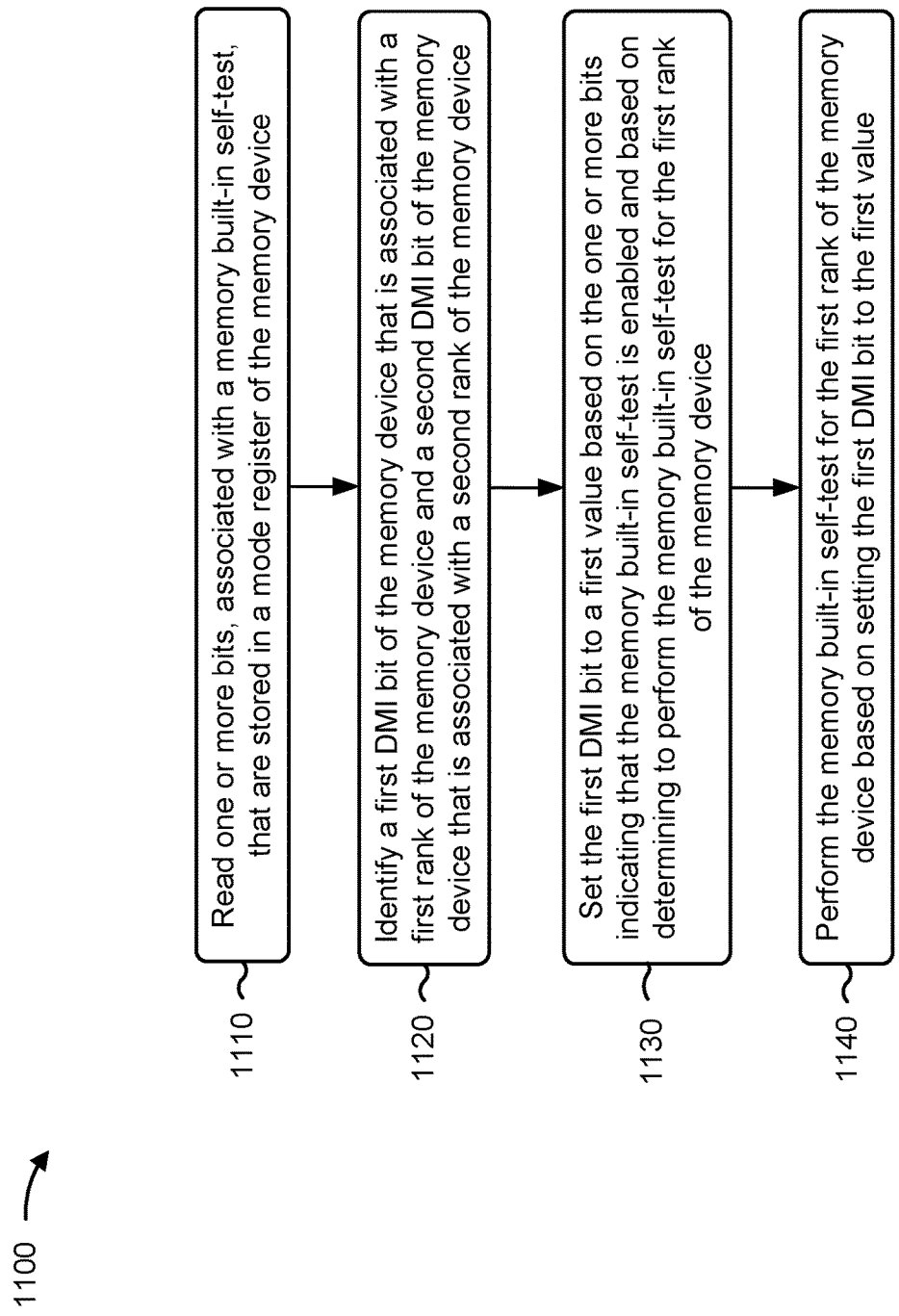
FIG. 11 is a flowchart of an example method associated with indicating a status of a memory built-in self-test for multiple memory device ranks.

One or more devices or components shown in FIG. 2 may be used to carry out operations described elsewhere herein, such as one or more operations of FIGS. 4-10 and/or one or more process blocks of the method of FIG. 11. For example, the controller 130 and/or the testing component 270 may perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
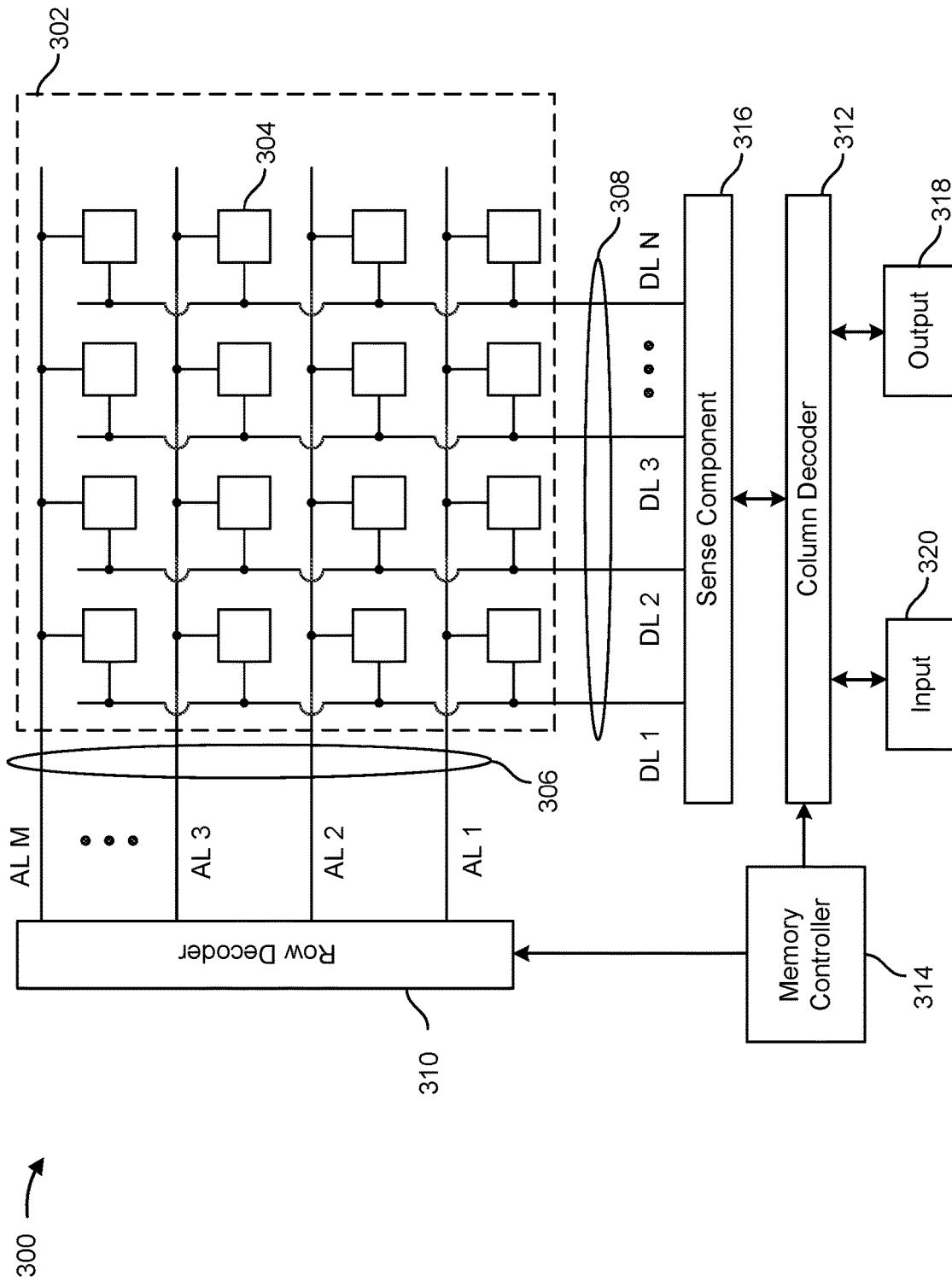
FIG. 3 is a diagrammatic view of an example memory device.

FIG. 3 is a diagrammatic view of an example memory device 300. The memory device 300 may include a memory array 302 that includes multiple memory cells 304. A memory cell 304 is programmable or configurable into a data state of multiple data states (e.g., two or more data states). For example, a memory cell 304 may be set to a particular data state at a particular time, and the memory cell 304 may be set to another data state at another time. A data state may correspond to a value stored by the memory cell 304. The value may be a binary value, such as a binary 0 or a binary 1, or may be a fractional value, such as 0.5, 1.5, or the like. A memory cell 304 may include a capacitor to store a charge representative of the data state. For example, a charged and an uncharged capacitor may represent a first data state and a second data state, respectively. As another example, a first level of charge (e.g., fully charged) may represent a first data state, a second level of charge (e.g., fully discharged) may represent a second data state, a third level of charge (e.g., partially charged) may represent a third data state, and so son.

Operations such as reading and writing (i.e., cycling) may be performed on memory cells 304 by activating or selecting the appropriate access line 306 (shown as access lines AL 1 through AL M) and digit line 308 (shown as digit lines DL 1 through DL N). An access line 306 may also be referred to as a "row line" or a "word line," and a digit line 308 may also be referred to a "column line" or a "bit line." Activating or selecting an access line 306 or a digit line 308 may include applying a voltage to the respective line. An access line 306 and/or a digit line 308 may comprise, consist of, or consist essentially of a conductive material, such as a metal (e.g., copper, aluminum, gold, titanium, or tungsten) and/or a metal alloy, among other examples. In FIG. 3, each row of memory cells 304 is connected to a single access line 306, and each column of memory cells 304 is connected to a single digit line 308. By activating one access line 306 and one digit line 308 (e.g., applying a voltage to the access line 306 and digit line 308), a single memory cell 304 may be accessed at (e.g., is accessible via) the intersection of the access line 306 and the digit line 308. The intersection of the access line 306 and the digit line 308 may be called an "address" of a memory cell 304.

In some implementations, the logic storing device of a memory cell 304, such as a capacitor, may be electrically isolated from a corresponding digit line 308 by a selection component, such as a transistor. The access line 306 may be connected to and may control the selection component. For example, the selection component may be a transistor, and the access line 306 may be connected to the gate of the transistor. Activating the access line 306 results in an electrical connection or closed circuit between the capacitor of a memory cell 304 and a corresponding digit line 308. The digit line 308 may then be accessed (e.g., is accessible) to either read from or write to the memory cell 304.

A row decoder 310 and a column decoder 312 may control access to memory cells 304. For example, the row decoder 310 may receive a row address from a memory controller 314 and may activate the appropriate access line 306 based on the received row address. Similarly, the column decoder 312 may receive a column address from the memory controller 314 and may activate the appropriate digit line 308 based on the column address.

Upon accessing a memory cell 304, the memory cell 304 may be read (e.g., sensed) by a sense component 316 to determine the stored data state of the memory cell 304. For example, after accessing the memory cell 304, the capacitor of the memory cell 304 may discharge onto its corresponding digit line 308. Discharging the capacitor may be based on biasing, or applying a voltage, to the capacitor. The discharging may induce a change in the voltage of the digit line 308, which the sense component 316 may compare to a reference voltage (not shown) to determine the stored data state of the memory cell 304. For example, if the digit line 308 has a higher voltage than the reference voltage, then the sense component 316 may determine that the stored data state of the memory cell 304 corresponds to a first value, such as a binary 1. Conversely, if the digit line 308 has a lower voltage than the reference voltage, then the sense component 316 may determine that the stored data state of the memory cell 304 corresponds to a second value, such as a binary 0. The detected data state of the memory cell 304 may then be output (e.g., via the column decoder 312) to an output component 318 (e.g., a data buffer). A memory cell 304 may be written (e.g., set) by activating the appropriate access line 306 and digit line 308. The column decoder 312 may receive data, such as input from input component 320, to be written to one or more memory cells 304. A memory cell 304 may be written by applying a voltage across the capacitor of the memory cell 304.

The memory controller 314 may control the operation (e.g., read, write, re-write, refresh, and/or recovery) of the memory cells 304 via the row decoder 310, the column decoder 312, and/or the sense component 316. The memory controller 314 may generate row address signals and column address signals to activate the desired access line 306 and digit line 308. The memory controller 314 may also generate and control various voltages used during the operation of the memory array 302.

In some implementations, the memory device 300 is the memory device 120. The memory device 300 may include multiple memory arrays 302, each of which may be tested separately. For example, a "section" of memory to be tested (e.g., using MBIST) may include a single memory array 302, may include multiple memory arrays 302, may include a portion of a single memory array 302 (e.g., a set of rows and/or columns), may include portions of multiple memory arrays 302, or some combination thereof. As described herein, the controller 130 (or the memory controller 314) may test one or more sections of memory using an MBIST procedure. In some cases, the controller 130 may indicate a status of the MBIST for one or more ranks of the memory device using a DMI pin and/or a corresponding DMI bit associated with the memory device 120.

As indicated above, FIG. 3 is provided as an example. Other examples may differ from what is described with respect to FIG. 3.

Figure 4:
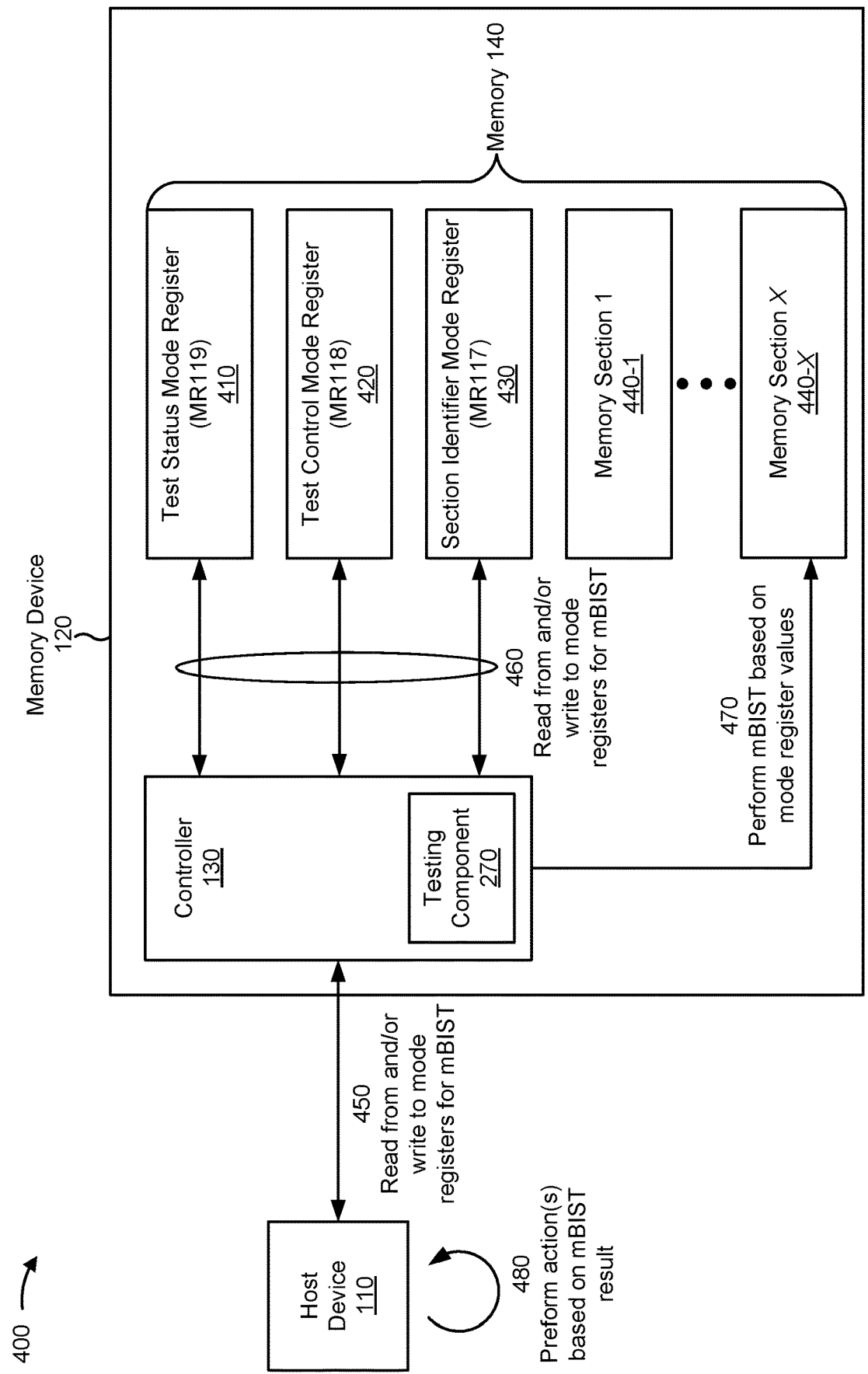
FIG. 4 is a diagram illustrating an example of memory section selection for a memory built-in self-test.

FIG. 4 is a diagram illustrating an example 400 of memory section selection for a memory built-in self-test. As shown in FIG. 4, a host device 110 and a memory device 120 may communicate with one another (e.g., via a host interface 150 between the host device 110 and a controller 130 of the memory device 120). The memory device 120 may include a controller 130, which may include a testing component 270. As further shown, the memory device 120 may include memory 140. As shown, the memory 140 may include a test status mode register 410, a test control mode register 420, a section identifier mode register 430, and multiple memory sections 440 (shown as memory section 440-1 through memory section 440-X).

A mode register is a location in memory 140 of the memory device 120. In some implementations, a mode register may store a default state upon power-up of the memory device 120 (e.g., may be configured to store a default set of values upon power-up, which may be indicated in firmware). Alternatively, the mode register may have an undefined state upon power-up, in which case the mode register may be programmed with an initial state. A mode register may store a specific quantity of bits (e.g., 8 bits, 12 bits, or 16 bits). A set of bits in the mode register (e.g., a set of one bit, a set of two bits, or a set of more than two bits) may form a bit field. In other words, a bit field of a mode register may include one or more bits of the mode register (e.g., a single bit or a plurality of bits). In some implementations, the host device 110 may set a value of a bit field to control an operating mode of the memory device 120. Additionally, or alternatively, the memory device 120 may set a value of a bit field to signal information to the host device 110, and the host device 110 may read the value of the bit field to identify the information. A specific bit field of a specific mode register may be used to define specific operating modes of the memory device 120 and/or for communicating specific information between the memory device 120 and the host device 110. In some implementations, the host device 110 writes to (e.g., programs) a mode register using a specific command (e.g., a mode register set command or a load mode register command). In some implementations, the host device 110 must write all of the bits of a mode register when writing to the mode register, rather than writing a subset of bits of the mode register. A mode register command cycle time (tMRD) may represent a time required to complete a write operation to a mode register. Additionally, or alternatively, the mode register command cycle may represent the minimum time required between two mode register commands.

Although the test status mode register 410, the test control mode register 420, and the section identifier mode register 430 have been given specific names for ease of description, these mode registers may be general purpose mode registers, in some implementations. Additional details regarding these mode registers are described below in connection with FIGS. 5-7.

The memory device 120 may include multiple (e.g., a plurality of) memory sections 440 that are testable using MBIST (e.g., that the memory device 120 is capable of testing using MBIST). A memory section 440 may include fewer than all memory cells (e.g., fewer than all volatile memory cells) of the memory device 120. For example, the memory device 120 may include multiple memory arrays, and a memory section 440 may be a single memory array. Additionally, or alternatively, a memory section 440 may be a subset (e.g., fewer than all) of the multiple memory arrays. In some implementations, a memory section 440 is a portion of a single memory array. Alternatively, a memory section 440 may include portions of multiple memory arrays. In some implementations, a memory section 440 includes all of a first memory array and a portion of a second memory array. In some implementations, the memory section 440 includes a set of rows and a set of columns (and thus, a set of memory cells), either of a single memory array or of multiple memory arrays. Thus, the memory 140 of the memory device 120 (e.g., the volatile memory of the memory device 120) may be divided or partitioned in any manner to form the multiple memory sections 440. As examples, the memory device 120 may include eight memory sections 440 that are testable using MBIST, may include sixteen memory sections 440 that are testable using MBIST, or the like.

As shown by reference number 450, the host device 110 may read from and/or write to one or more mode registers of the memory device 120 to control an MBIST procedure and/or to obtain information associated with the MBIST procedure from the memory device 120. For example, the host device 110 may write to the test control mode register 420 and/or the section identifier mode register 430 to control the MBIST procedure. Additionally, or alternatively, the host device 110 may read from the test status mode register 410 to obtain information regarding the MBIST procedure from the memory device 120. Additional details are described elsewhere herein.

As shown by reference number 460, the controller 130 may read from and/or write to one or more mode registers of the memory device 120 to identify a manner in which an MBIST procedure is to be performed (e.g., under control of the host device 110) and/or to signal information associated with the MBIST procedure to the host device 110. For example, the controller 130 may read from the test control mode register 420 and/or the section identifier mode register 430 to determine a manner in which the MBIST procedure is to be performed. Additionally, or alternatively, the controller 130 may write to the test status mode register 410 to signal information regarding the MBIST procedure to the host device 110. Additional details are described elsewhere herein.

As shown by reference number 470, the controller 130 may perform the MBIST procedure based on one or more mode register values. For example, the controller 130 may perform the MBIST procedure based on values stored in the test control mode register 420 and/or the section identifier mode register 430. The controller 130 may write to the test status mode register 410 to communicate a result of the MBIST procedure to the host device 110. In some implementations, the controller 130 may identify a subset of memory sections 440 (e.g., fewer than all testable memory sections 440) to be tested (e.g., based on one or more values stored in the section identifier mode register 430) and may perform MBIST on that subset of memory sections 440. In some cases, the controller 130 may indicate a status of the MBIST for one or more ranks of the memory device using a DMI pin and/or a corresponding DMI bit associated with the memory device 120. Additional details are described elsewhere herein.

As shown by reference number 480, the host device 110 may perform one or more actions based on a result of the MBIST procedure. For example, the host device 110 may read the test status mode register 410 to determine a result of the MBIST procedure. Based on the result (sometimes called an "MBIST result"), the host device 110 may perform an action. For example, the host device 110 may issue one or more commands to the memory device 120 (e.g., to perform additional MBIST testing or to perform a PPR procedure), may update data stored by the host device 110 to control future commands associated with MBIST testing, and/or may take corrective action (e.g., disabling use of the memory device 120, outputting an alert, or the like).

As indicated above, FIG. 4 is provided as an example. Other examples may differ from what is described with regard to FIG. 4.

Figure 5:
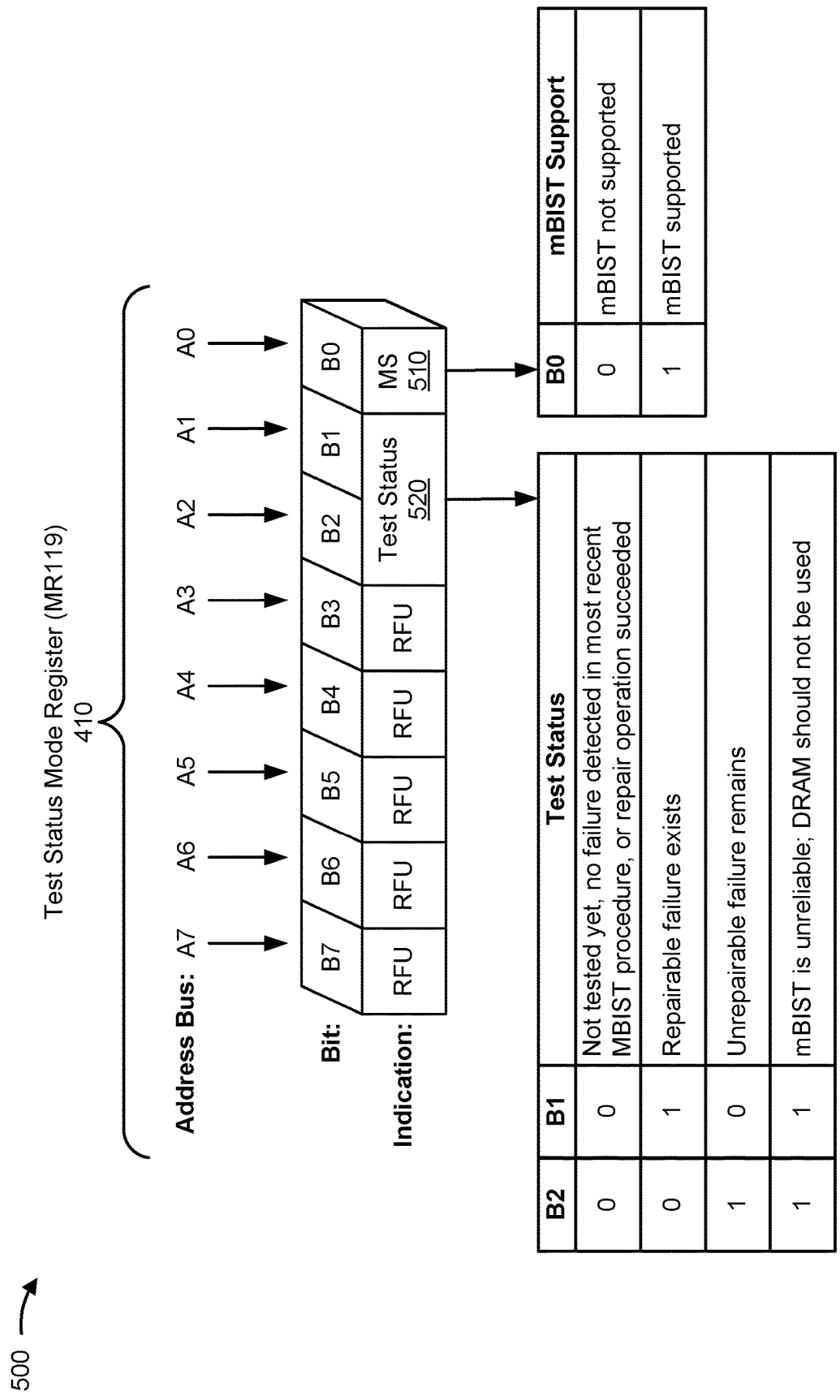
FIGS. 5-7 are diagrams of example mode registers.

FIG. 5 is a diagram of an example mode register 500. As shown, the mode register 500 may be the test status mode register 410. As further shown, the test status mode register 410 may include a set of bits, such as a set of eight bits, labeled B0 through B7. In some implementations, the test status mode register 410 may be designated as mode register 119 (MR119).

As shown, an MBIST support field 510 (shown as "MS") of the test status mode register 410 may be used to indicate whether the memory device 120 supports MBIST. As shown, the MBIST support field 510 may include a single bit (shown as B0). A first value of the MBIST support field 510 (e.g., "0") may indicate that the memory device 120 does not support MBIST. A second value of the MBIST support field 510 (e.g., "1") may indicate that the memory device 120 supports MBIST. In some implementations, a value of the MBIST support field 510 may be written by the memory device 120 to indicate, to the host device 110, whether the memory device 120 supports MBIST.

As shown, a test status field 520 (shown as "Test Status") of the test status mode register 410 may be used to indicate a test status of an MBIST procedure (which may include an MBIST result or a test result). As shown, the test status field 520 may include two bits (shown as B1 and B2). Different values of the test status field 520 may indicate different test statuses and/or different MBIST results. For example, a first value of the test status field 520 (e.g., "00") may indicate that MBIST has not yet been performed (shown as "not tested yet"), that no failures were based on performing an MBIST procedure (e.g., a most recent MBIST procedure performed on one or more memory sections), or that a repair operation (e.g., PPR) has succeeded. A second value of the test status field 520 (e.g., "01") may indicate that MBIST has been performed and that a repairable failure exists (e.g., was detected) in one or more memory sections. A third value of the test status field 520 (e.g., "10") may indicate that MBIST has been performed and that an unrepairable failure remains (e.g., was detected) in one or more memory sections. A fourth value of the test status field 520 (e.g., "11") may indicate that MBIST is unreliable and/or that the memory device 120 should not be used. In some implementations, the memory device 120 is configured to write a value of the test status field 520 (e.g., based on performing MBIST on one or more memory sections) to indicate, to the host device 110, a test status and/or a test result for one or more memory sections.

As shown in FIG. 5, one or more bits of the test status mode register 410 (e.g., bits B3 through B7) may be reserved for other operations (shown as RFU, or reserved for future use) and/or may be used to indicate one or more test statuses other than those described herein.

As shown in FIG. 5 (and also in FIG. 6 and FIG. 7), when the memory device 120 is operating in a testing mode, a set of address signals A0 through A7 may be used to set values of corresponding bits B0 through B7 (e.g., to a zero or a one) of a mode register. A specific address signal may be input via a specific pin of the memory device 120 (e.g., via the host interface 150) and/or may be received via a specific bus of the memory device 120 (e.g., that connects to the specific pin or to an internal component of the memory device 120 configured to control mode register values). For example, the address signal A0 used to set the value of B0 may be received via a pin A0 and/or an address bus A0. When the memory device is not operating in the testing mode (e.g., is operating in a normal mode), the address signals may be used to provide memory addresses for a read operation or a write operation. Although the address signals A0 through A7 are shown as controlling the values of bits B0 through B7, respectively, different address signals may be used to control the values of bits B0 through B7 in some implementations.

As indicated above, FIG. 5 is provided as an example. Other examples may differ from what is described with regard to FIG. 5.

Figure 6:
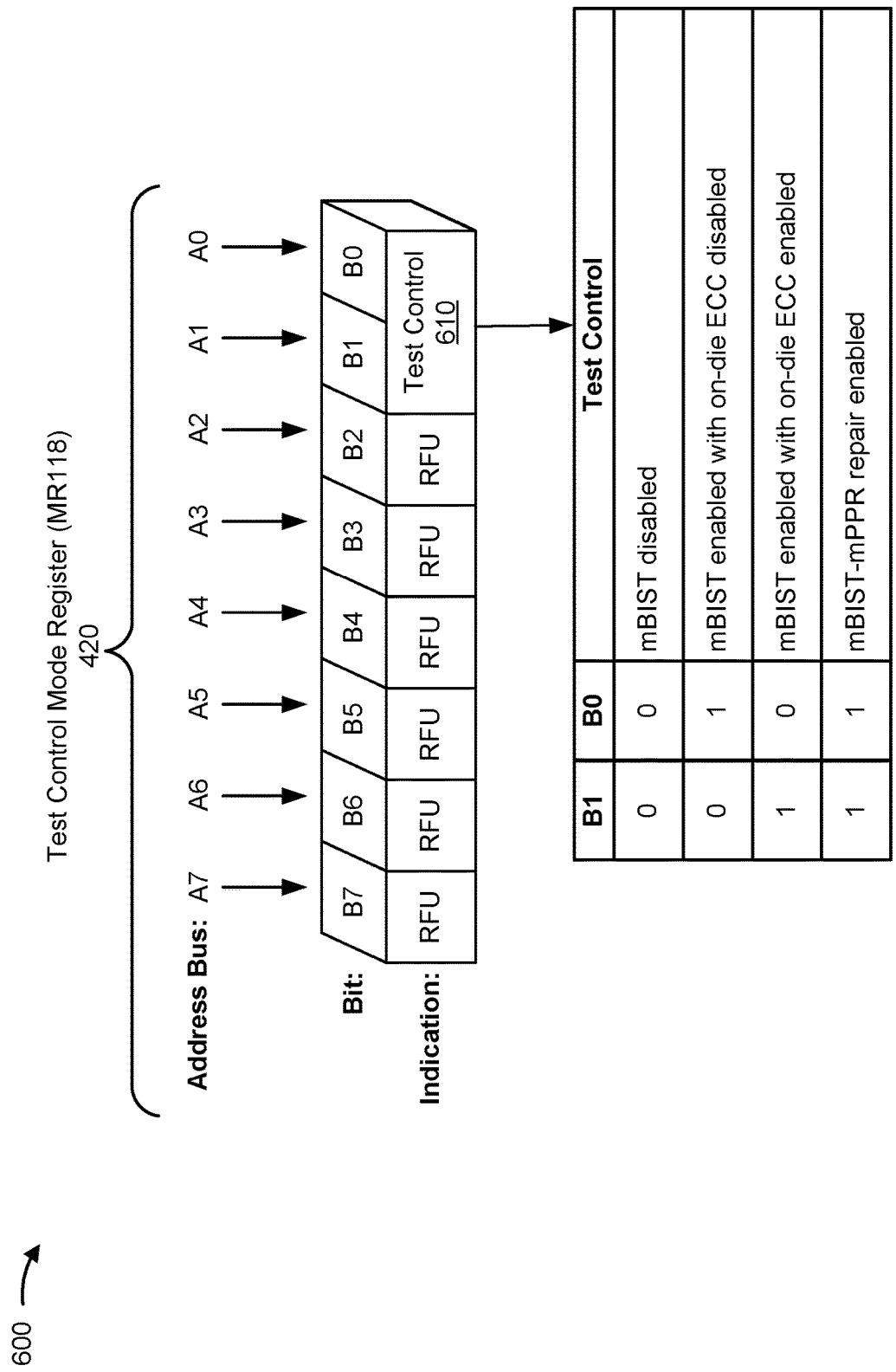

FIG. 6 is a diagram of an example mode register 600. As shown, the mode register 600 may be the test control mode register 420. As further shown, the test control mode register 420 may include a set of bits, such as a set of eight bits, labeled B0 through B7. In some implementations, the test control mode register 420 may be designated as mode register 118 (MR118).

In some implementations, a test control field 610 (shown as "Test Control") of the test control mode register 420 may be used to control an MBIST operating mode. As shown, the test control field 610 may include two bits (shown as B0 and B1). Different values of the test control field 610 may indicate different MBIST operating modes. For example, a first value of the test control field 610 (e.g., "00") may indicate that MBIST is disabled. A second value of the test control field 610 (e.g., "01") may indicate that MBIST is enabled with on-die error-correcting code (ECC) disabled. A third value of the test control field 610 (e.g., "10") may indicate that MBIST is enabled with on-die ECC enabled. A fourth value of the test control field 610 (e.g., "11") may indicate that a repair mode, such as PPR (shown as MBIST-MPPR), is enabled (or that MBIST with PPR is enabled). In some implementations, a value of the test control field 610 may be written by the host device 110 to control operation of an MBIST procedure and/or a repair procedure to be performed by the memory device 120.

As shown in FIG. 6, one or more bits of the test control mode register 420 (e.g., bits B2 through B7) may be reserved for other operations (shown as RFU, or reserved for future use).

As indicated above, FIG. 6 is provided as an example. Other examples may differ from what is described with regard to FIG. 6.

Figure 7:
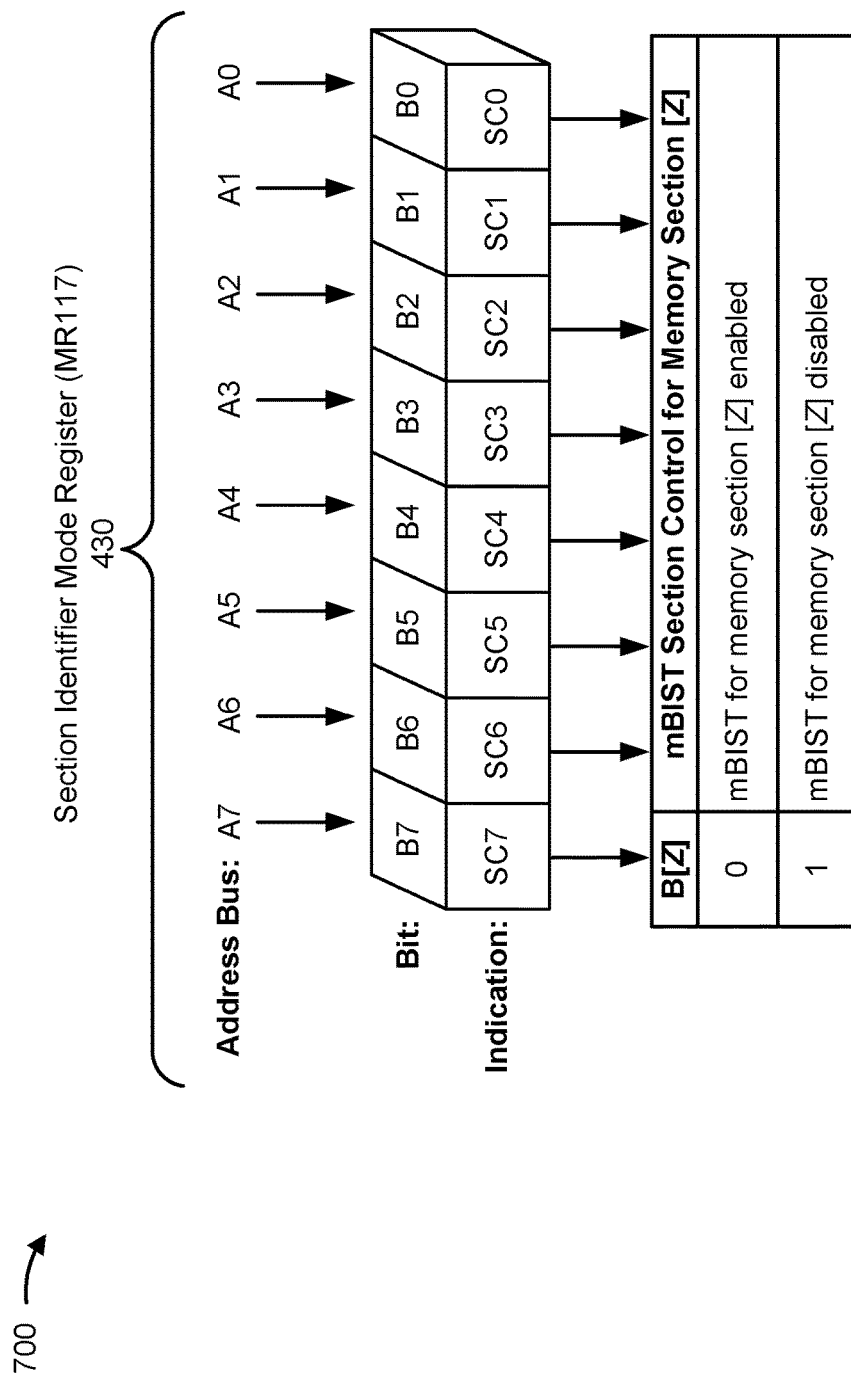

FIG. 7 is a diagram of an example mode register 700. As shown, the mode register 600 may be the section identifier mode register 430. As further shown, the section identifier mode register 430 may include a set of bits, such as a set of eight bits, labeled B0 through B7. In some implementations, the section identifier mode register 430 may be designated as mode register 117 (MR117).

As shown, the section identifier mode register 430 may include multiple section control fields (shown as SC0 through SC7). A section control field may be used to control whether MBIST is performed for a specific memory section of the memory device 120. In some implementations, a section control field may include a single bit. A value of a section control field may indicate whether an MBIST procedure is to be performed for a memory section corresponding to that section control field. For example, a first value of a section control field (e.g., "0") may indicate that MBIST is enabled for a memory section corresponding to that section control field. A second value of the test control field 610 (e.g., "1") may indicate that MBIST is disabled for a memory section corresponding to that section control field. In some implementations, a value of the section control field may be written by the host device 110 to control the section(s) for which an MBIST procedure is to be performed by the memory device 120.

In some implementations, each bit in the section identifier mode register 430 corresponds to a different memory section. For example, bit Z (shown as "B[Z]") may correspond to memory section Z. In this case, a first value of bit Z (e.g., "0") may indicate that MBIST is enabled for memory section Z, and a second value of bit Z (e.g., "1") may indicate that MBIST is disabled for memory section Z. For example, a first value of B0 (e.g., "0") may indicate that MBIST is enabled for memory section 0, and a second value of B0 (e.g., "1") may indicate that MBIST is disabled for memory section 0. Similarly, a first value of B1 (e.g., "0") may indicate that MBIST is enabled for memory section 1, and a second value of B1 (e.g., "1") may indicate that MBIST is disabled for memory section 1, and so on. In some implementations, two (or more) bits may be used to indicate a combination of memory sections for which MBIST is enabled or disabled.

Although the section identifier mode register 430 is shown as including eight bits corresponding to eight memory sections 440, the section identifier mode register 430 may include a different quantity of bits corresponding to a different quantity of memory sections 440 in some implementations. For example, the section identifier mode register 430 may include two bits corresponding to two memory sections 440, may include four bits corresponding to four memory sections 440, may include twelve bits corresponding to twelve memory sections 440, may include sixteen bits corresponding to sixteen memory sections 440, or the like.

As indicated above, FIG. 7 is provided as an example. Other examples may differ from what is described with regard to FIG. 7.

Figure 8A:
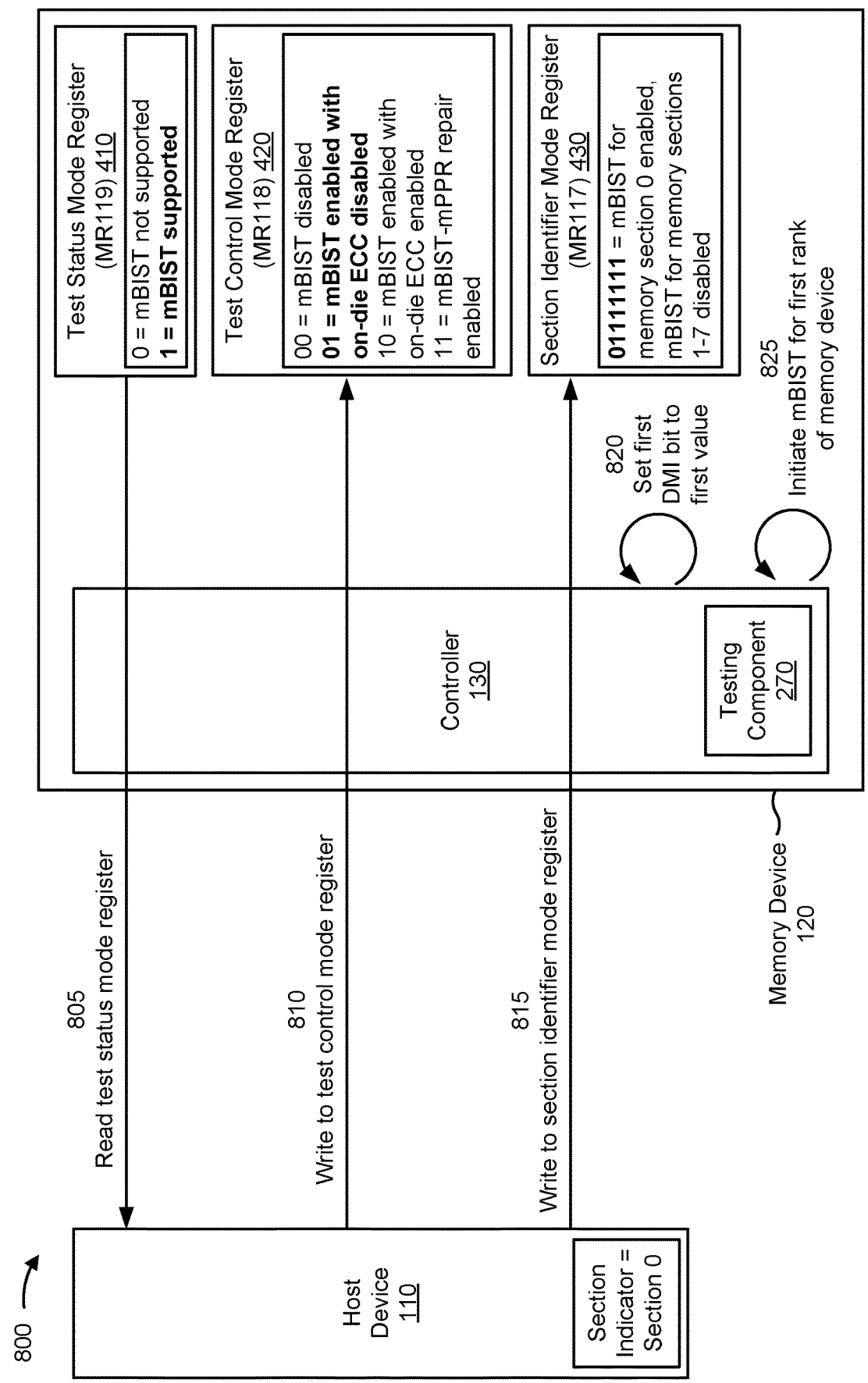
FIGS. 8A-8B are diagrams illustrating an example of performing a memory built-in self-test and indicating a status of the memory built-in self-test for multiple memory device ranks.
Figure 8B:
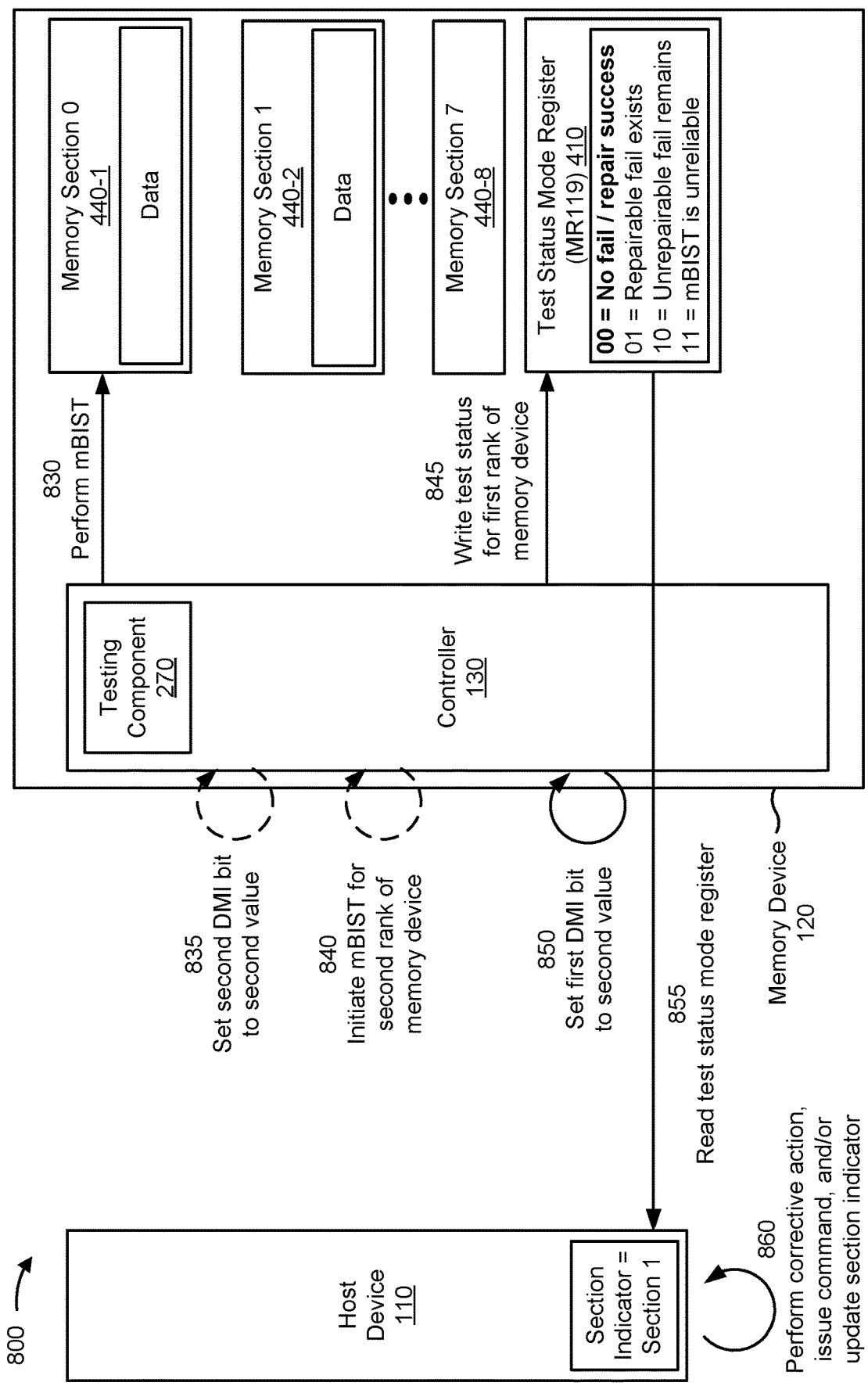

FIGS. 8A-8B are diagrams of an example 800 of performing an MBIST and indicating a status of the MBIST for multiple memory device ranks. As shown in FIGS. 8A and 8B, a host device 110 and a memory device 120 may communicate with one another (e.g., via a host interface 150 between the host device 110 and a controller 130 of the memory device 120). The memory device 120 may include a controller 130, which may include a testing component 270. As further shown, the memory device 120 may include memory 140. As shown, the memory 140 may include a test status mode register 410, a test control mode register 420, a section identifier mode register 430, and multiple memory sections 440 (shown as memory sections 440-1, 440-2, . . . , 440-8).

As shown by reference number 805, in some implementations, the host device 110 may read the test status mode register 410 to determine whether the memory device 120 supports MBIST. For example, the host device 110 may read the MBIST support field 510 of the test status mode register 410 to determine whether the memory device 120 supports MBIST. However, in some implementations, the host device 110 need not read the test status mode register 410 to determine whether the memory device 120 supports MBIST. For example, in a system 100 where the host device 110 and the memory device 120 are tightly integrated, the host device 110 may store information about the memory device 120, such as an indication of whether the memory device 120 supports MBIST. Alternatively, the host device 110 may trigger MBIST (e.g., by writing to the test control mode register 420, as described below) without first determining whether the memory device 120 supports MBIST. In the example 800, the host device 110 reads a value of "1" from the test status mode register 410, indicating that MBIST is supported by the memory device 120.

In some implementations, the memory device 120 may transmit, to the host device 110, an indication that MBIST is supported by the memory device 120. For example, the host device 110 may read the test status mode register 410 by transmitting a read command (e.g., a mode register read (MRR) command) to the memory device 120. Based on the read command, the memory device 120 may read the test status mode register 410 and may transmit a value stored in the test status mode register 410 to the host device 110. In some implementations, the host device 110 may verify support for MBIST, and/or the memory device 120 may transmit an indication that MBIST is supported by the memory device 120, prior to performing one or more operations described below (e.g., prior to the host device 110 writing to and/or the memory device reading from the test control mode register 420 and/or the section identifier mode register 430).

As shown by reference number 810, the host device 110 may write to the test control mode register 420 (e.g., by issuing a mode register write (MRW) command) to enable MBIST to be performed by the memory device 120. For example, the host device 110 may write to the test control field 610 of the test control mode register 420 to enable MBIST to be performed by the memory device 120. In some implementations, the host device 110 may write a particular value (e.g., "01," "10," and/or "11") to trigger MBIST and/or to control a manner in which the memory device 120 performs MBIST. For example, the host device 110 may control whether the memory device 120 performs MBIST with ECC (e.g., on-die ECC) enabled, whether the memory device 120 performs MBIST with ECC (e.g., on-die ECC) disabled, or whether the memory device performs MBIST-MPPR. Details regarding these MBIST modes are described below in connection with FIGS. 9A and 9B. In some implementations, the host device 110 may write to the test control mode register 420 based on determining that the memory device 120 supports MBIST (e.g., after reading the test status mode register 410 and waiting for the mode register command cycle time, tMRD). In example 800, the host device 110 writes a value of "01" to the test control mode register 420, instructing the memory device 120 to perform MBIST with on-die ECC disabled.

In some implementations, enabling (or disabling) the MBIST may enable (or disable) the MBIST for all ranks of the memory device 120. For example, the value of "00" in the test control mode register 420 may indicate that MBIST is disabled for all ranks of the memory device 120, the value of "01" in the test control mode register 420 may indicate that MBIST is enabled with on-die ECC disabled for all ranks of the memory device 120, the value of "10" in the test control mode register 420 may indicate that MBIST is enabled with on-die ECC enabled for all ranks of the memory device 120, and the value of "11" in the test control mode register 420 may indicate that an MBIST repair mode is enabled for all ranks of the memory device 120. In some implementations, the MBIST may be separately enabled or disabled for the different ranks of the memory device 120. For example, the host device 110 may write a value (or values) to the test control mode register 420 to indicate whether the MBIST is enabled or disabled for the first rank of the memory device 120, and may write another value (or values) to the test control mode register 420 to indicate whether the MBIST is enabled or disabled for the second rank of the memory device 120.

In some implementations, the host device 110 may initiate MBIST (e.g., by reading from the test status mode register 410 and/or writing to the test control mode register 420) based on detecting a condition. For example, if MBIST is to be performed as part of a power down procedure, then the host device 110 may initiate MBIST based on detecting that a power down procedure has been initiated or is occurring for the system 100, the host device 110, and/or the memory device 120. This may prevent interference with normal memory operations during operation of the system 100. Additionally, or alternatively, if MBIST is to be performed as part of a power up procedure, then the host device 110 may initiate MBIST based on detecting that a power up procedure has been initiated or is occurring for the system 100, the host device 110, and/or the memory device 120 (e.g., during a power up initialization sequence and/or prior to host data or payload data being written to the memory device 120). This may prevent interference with normal memory operations during operation of the system 100. Additionally, or alternatively, the host device 110 may initiate MBIST based on detecting that all memory arrays (e.g., memory banks) of the memory device 120 are in an idle state (e.g., the memory device 120 is in an "all banks idle" state). This may prevent interference with normal memory operations. In some implementations, the host device 110 may initiate MBIST only when the memory sections 440 to be tested have not yet been programmed (e.g., during initialization and prior to normal use of the memory device 120 to store data). This may prevent overwriting of data stored in those memory sections.

As shown by reference number 815, the host device 110 may write to the section identifier mode register 430 (e.g., by issuing an MRW command) to indicate one or more memory sections 440 for which MBIST is to be performed. For example, the host device 110 may write a first value (e.g., "0") to each section control field, of the section identifier mode register 430, that corresponds to a memory section 440 for which MBIST is to be performed. As another example, the host device 110 may write a second value (e.g., "1") to each section control field, of the section identifier mode register 430, that corresponds to a memory section 440 for which MBIST is not to be performed. The first value may be called an "enabling value," and the second value may be called a "disabling value." In some implementations, the one or more memory sections 440 may be associated with first rank of the memory device 120. For example, the host device 110 may write to the section identifier mode register 430 to indicate one or more memory sections 440 associated with the first rank of the memory device 120 based on the MBIST being performed for the first rank of the memory device. In some implementations, the host device 110 may write to the section identifier mode register 430 after writing to the test control mode register and waiting for the mode register command cycle time, tMRD.

In some implementations, the host device 110 may be configured to write a single enabling value to the section identifier mode register 430 to enable MBIST for a single memory section 440 during a particular MBIST procedure (e.g., during execution of a single MBIST procedure). In this case, the host device 110 may write the enabling value to a single bit of the section identifier mode register 430, and may write the disabling value to all other bits of the section identifier mode register 430. For example, in example 800, the host device 110 writes a value of "0" to a first bit (e.g., B0) to enable MBIST for a first memory section (e.g., memory section 0), and the host device 110 writes a value of "1" to all other bits (e.g., B1 through B7) to disable MBIST for all other memory sections (e.g., memory sections 1 through 7). Alternatively, the host device 110 may write multiple enabling values to the section identifier mode register 430 to enable MBIST for multiple memory sections 440 (e.g., at least two memory sections 440) during execution of a single MBIST procedure.

In some implementations, the host device 110 may store a section indicator that indicates a memory section 440 to be tested during a next execution of MBIST. In example 800 of FIG. 8A, the host device 110 stores a section indicator that indicates that memory section 0 is to be tested during a next execution of MBIST. For example, the host device 110 may store a value of "0" for the section indicator to indicate that memory section 0 is to be tested next. The host device 110 may write to the section identifier mode register 430 based on the section indicator (e.g., based on a stored value of the section indicator). In example 800, the host device 110 writes a value of "01111111" to the section identifier mode register 430, to indicate that memory section 0 is to be tested during a next MBIST procedure, based on the stored value of "0" for the section indicator. The host device 110 may update the section indicator periodically, based on a timer, and/or based on determining that the memory device 120 has performed MBIST (e.g., has performed an MBIST procedure or has executed MBIST), as described in more detail in connection with FIG. 8B.

Although some implementations are described herein in connection with the host device 110 indicating the memory section(s) 440 to be tested, in some implementations, the host device 110 may instruct the memory device 120 to perform MBIST (e.g., by writing to the test control mode register 420), and the memory device 120 may identify one or more memory sections 440 to be tested (e.g., for which MBIST is enabled) without receiving an indication from the host device 110 indicating which memory section(s) 440 to test. For example, the memory device 120 may store a section indicator (e.g., in non-volatile memory) in a similar manner as described herein in connection with the section indicator stored by the host device 110. In this case, upon receiving an instruction to perform MBIST, the memory device 120 may use the stored section indicator to identify the one or more memory sections 440 to be tested. The memory device 120 may modify (e.g., increment) the section indicator stored by the memory device 120 in a similar manner as described herein in connection with the section indicator stored by the host device 110.

As shown by reference number 820, the memory device 120 may set the first DMI bit to a first value. In some implementations, the memory device 120 may set the first DMI bit to a first value (e.g., "0") based on the test control mode register 420 indicating that MBIST is enabled and/or based on determining to perform the MBIST for the first rank of the memory device 120. In some implementations, the memory device 120 may set the first DMI bit to the first value prior to initiating the MBIST for the first rank of the memory device 120. For example, the memory device 120 may determine that MBIST is enabled (based on the value of test control mode register 420), may determine to perform the MBIST for the first rank of the memory device 120, may set the first DMI bit (associated with the first rank of the memory device 120) to the first value, and may initiate the MBIST for the first rank of the memory device 120 after setting the first DMI bit to the first value. Setting the first DMI bit to the first value may indicate, to the host device 110, that the memory device 120 is currently performing the MBIST for the first rank of the memory device 120. Thus, the host device 110 may be configured not to interrupt the MBIST that is being performed for the first rank of the memory device 120 while the first DMI bit is set to the first value. Alternatively, setting the first DMI bit to a second value (e.g., "1") may indicate, to the host device 110, that the memory device 120 is not currently performing the MBIST for the first rank of the memory device 120. In some implementations, the first DMI bit may indicate the status of the MBIST for the first rank of the memory device 120 while the MBIST is enabled by the host device 110 (e.g., as indicated by the test control mode register 420). In contrast, when the MBIST is disabled by the host device 110, the first DMI bit may indicate a data mask inversion function to be applied to data associated with a standard memory operation of the memory device 120.

In some implementations, the memory device 120 may set the first DMI bit to the first value based on a configuration of the memory device 120. For example, the configuration of the memory device 120 may indicate that the first DMI bit should be set to the first value to indicate that the memory device 120 is performing the MBIST for the first rank of the memory device 120 and that the first DMI bit should be set to the second value to indicate that the memory device 120 is not performing the MBIST for the first rank of the memory device 120. In some implementations, the memory device 120 may set the first DMI bit to the first value or the second value based on an auto-sensing operation. For example, the memory device 120 may use auto-sensing to detect (based on signaling from the host device 110) that the first DMI bit should be set to the first value to indicate that the memory device 120 is performing the MBIST for the first rank of the memory device 120 and that the first DMI bit should be set to the second value to indicate that the memory device 120 is not performing the MBIST for the first rank of the memory device 120. In some implementations, the memory device 120 may set the first DMI bit to the first value or the second value based on a pull-up operation or a pull-down operation. For example, the memory device 120 may pull-up the first DMI bit from the second state (or from a float state) to the first state based on determining to initiate the MBIST for the first rank of the memory device 120. Alternatively, the memory device 120 may pull-down the first DMI bit from the first state (or from the float state) to the second state based on the memory device 120 not performing the MBIST for the second rank of the memory device 120 (e.g., based on completing the MBIST for the second rank of the memory device 120). Similar operations may be performed for the second rank of the memory device 120. For example, the memory device 120 may set the second DMI bit to the second value to indicate that the memory device is performing the MBIST for the second rank of the memory device, or may set the second DMI bit to the first value to indicate that the memory device is not performing the MBIST for the second rank of the memory device, based on a configuration of the memory device 120, an auto-sensing operation, or using a pull-up or pull-down operation.

As shown by reference number 825, the memory device 120 may initiate the MBIST for the first rank of the memory device 120 based on the test control mode register 420. For example, the memory device 120 may identify whether the MBIST is to be performed with on-die ECC disabled or with on-die ECC enabled based on a value (or values) stored in and/or read from the test control mode register 420. In some implementations, the memory device 120 may read a set of bits (e.g., a first set of bits) stored in the test control mode register 420 (sometimes called a first mode register). The memory device 120 may identify a test mode, for performing the MBIST for the first rank of the memory device 120, based on reading the set of bits stored in the test control mode register 420. For example, the test mode may be indicated in the test control field 610 of the test control mode register 420, as described above in connection with FIG. 6. The test mode may indicate that MBIST is disabled, that MBIST is enabled with on-die ECC disabled, that MBIST is enabled with on-die ECC enabled, or that a repair mode is enabled.

Additionally, or alternatively, the memory device 120 may initiate the MBIST for the first rank of the memory device 120 (with on-die ECC disabled or with on-die ECC enabled) based on the section identifier mode register 430. For example, the memory device 120 may identify the one or more memory sections (e.g., associated with the first rank of the memory device 120) for which the MBIST is to be performed based on a value (or values) stored in and/or read from the section identifier mode register 430. In some implementations, the memory device 120 may read a set of bits (e.g., a second set of bits) stored in the section identifier mode register 430 (sometimes called a second mode register). The memory device 120 may identify one or more memory sections 440, for which MBIST is to be performed, based on reading the set of bits stored in the section identifier mode register 430. For example, the one or more memory sections 440 may be indicated in the section control fields of the section identifier mode register 430, as described above in connection with FIG. 7. In some implementations, the one or more memory sections 440 identified by the memory device 120 are a subset of all testable memory sections into which the memory device 120 is divided. The memory device 120 may perform MBIST for the one or more identified memory sections 440 (e.g., based on the test mode). In some implementations, the memory device 120 may identify one or more bits, in the set of bits stored in the section identifier mode register 430, that are set to a particular value (e.g., "0"). The memory device 120 may identify the one or more memory sections 440, for which MBIST is to be performed, as the one or more memory sections 440 corresponding to the one or more bits that are set to the particular value.

As shown in FIG. 8B, and by reference number 830, the memory device 120 may perform MBIST on a first memory section (e.g., where the memory device 120 includes eight testable memory sections, such as memory section 0 through memory section 7) based on the value "01111111" read from the section identifier mode register 430. The value "01111111" instructs the memory device 120 to perform MBIST on a first memory section (shown as memory section 0), and to refrain from performing MBIST on a second memory section, a third memory section, a fourth memory section, a fifth memory section, a sixth memory section, a seventh memory section, and an eighth memory section.

As shown by reference number 835, the memory device 120 may (optionally) set the second DMI bit to a second value. In some implementations, the memory device 120 may set the second DMI bit to the second value (e.g., "1") based on the test control mode register 420 indicating that MBIST is enabled and/or based on determining to perform the MBIST for the second rank of the memory device 120. In some implementations, the memory device 120 may set the second DMI bit to the second value prior to initiating the MBIST for the second rank of the memory device 120. For example, the memory device 120 may determine that MBIST is enabled (based on the value of test control mode register 420), may determine to perform the MBIST for the second rank of the memory device 120, may set the second DMI bit (associated with the second rank of the memory device 120) to the second value, and may initiate the MBIST for the second rank of the memory device 120 after setting the second DMI bit to the second value. Setting the second DMI bit to the second value may indicate, to the host device 110, that the memory device 120 is currently performing the MBIST for the second rank of the memory device 120. Thus, the host device 110 may be configured not to interrupt the MBIST that is being performed for the second rank of the memory device 120 while the second DMI bit is set to the first value. Alternatively, setting the second DMI bit to the first value (e.g., "0") may indicate, to the host device 110, that the memory device 120 is not currently performing the MBIST for the second rank of the memory device 120. Example values the first rank of the memory device 120 and the second rank of the memory device 120 (when MBIST is enabled) are shown in Table 1 below.

TABLE 1

DMI Values
MBIST enabled

| | First DMI bit | Second DMI bit |
|---|---|---|
| 1 | MBIST is being performed for the first rank of the memory device | MBIST is not being performed for the second rank of the memory device |
| 0 | MBIST is not being performed for the first rank of the memory device | MBIST is being performed for the second rank of the memory device |

In some implementations, the second DMI bit may be in a float state (e.g., may not have the first value or the second value) when the first DMI bit indicates that the memory device 120 is performing the MBIST for the first rank of the memory device. Additionally, or alternatively, the first DMI bit may be in the float state when the second DMI bit indicates that the memory device 120 is performing the MBIST for the second rank of the memory device. In some implementations, as described below, at least a portion of the MBIST for the first rank of the memory device 120 and the MBIST for the second rank of the memory device may be performed simultaneously.

As shown by reference number 840, the memory device 120 may initiate the MBIST for the second rank of the memory device based on the test control mode register 420 and/or the test status mode register 430. For example, the memory device 120 may identify whether the MBIST for the second rank of the memory device 120 is to be performed with on-die ECC disabled or with on-die ECC enabled based on the value (or values) stored in and/or read from the test control mode register 420. Additionally, or alternatively, the memory device 120 may determine one or more memory sections, associated with the second rank of the memory device, for which the MBIST is to be performed based on the value (or values) stored in and/or read from the test status mode register 430. The memory device 120 may perform the MBIST for the second rank of the memory device based on initiating the MBIST for the second rank of the memory device.

In some implementations, the MBIST for the first rank of the memory device may at least partially overlap with the MBIST for the second rank of the memory device. For example, the memory device 120 may set the first DMI bit to the first value and may initiate the MBIST for the first rank of the memory device 120 (as described in connection with reference number 825). In some implementations, the memory device 120 may initiate the MBIST for the second rank of the memory device, and may set the second DMI bit to the second value, while the memory device 120 is performing the MBIST for the first rank of the memory device 120. Thus, at least a portion of the MBIST for the first rank of the memory device 120 and the MBIST for the second rank of the memory device 120 may be performed simultaneously. In some implementations, the host device 110 may be configured to separately monitor the first DMI bit and the second DMI bit. For example, the host device 110 may monitor the first DMI bit to determine whether the memory device 120 is performing the MBIST for the first rank of the memory device 120 and may monitor the second DMI bit to determine whether the memory device 120 is performing the MBIST for the second rank of the memory device. The host device 110 may determine that the memory device 120 is performing the MBIST for the first rank of the memory device 120 based on the first DMI bit having the first value (e.g., "1") and/or may determine that the memory device 120 is performing the MBIST for the second rank of the memory device 120 based on the second DMI bit having the second value (e.g., "0"). Alternatively, the host device 110 may determine that the memory device 120 is not performing the MBIST for the first rank of the memory device 120 based on the first DMI bit having the second value (or being in the float state) and/or may determine that the memory device 120 is not performing the MBIST for the second rank of the memory device 120 based on the second DMI bit having the first value (or being in the float state).

As shown by reference number 845, the memory device 120 may write a test status to the test status mode register 410 based on a result of performing MBIST on the one or more identified memory sections 440 (sometimes called one or more tested memory sections 440 to indicate that the memory section(s) 440 have been tested using MBIST). For example, the memory device 120 may write to a set of bits (e.g., a third set of bits) stored in the test status mode register 410 (sometimes called a third mode register) to indicate an MBIST result for the one or more tested memory sections 440. The memory device 120 may write the test status to a test status field 520 of the test status mode register 410, as described above in connection with FIG. 5. The test status may indicate, for example, that no failure was detected in the one or more tested memory sections 440 based on performing MBIST on those memory section(s), that a repairable failure exists (e.g., was detected) in the one or more tested memory sections 440 based on performing MBIST on those memory section(s), that an unrepairable failure remains (e.g., was detected) in the one or more tested memory sections 440 based on performing MBIST on those memory section(s), or that MBIST is unreliable (and the memory device 120 should not be used).

In example 800, the memory device 120 tests a single memory section 440 based on the value read from the section identifier mode register 430. For example, the memory device 120 may test a single memory section 440 using MBIST and then may write a test status for the single memory section 440 to the test status mode register 410. However, in some implementations, the memory device 120 tests multiple memory sections 440 based on the value read from the section identifier mode register 430. For example, the memory device 120 may test multiple, but fewer than all, testable memory sections 440. If the host device 110 had written a value of "00111111," then the memory device 120 would perform MBIST on the first memory section 440-1 and the second memory section 440-2, and would refrain from performing MBIST on the remaining six memory sections 440. The memory device 120 may then write a test status for the tested memory sections 440 (e.g., the first memory section 440-1 and the second memory section 440-2) to the test status mode register 410 upon completing testing.

As shown by reference number 850, the memory device 120 may set the first DMI bit to a second value. In some implementations, the memory device 120 may set the first DMI bit to the second value (e.g., "0") based on completing the MBIST for the first rank of the memory device 120. For example, the memory device 120 may set the first DMI bit to the second value to indicate, to the host device 110, that the memory device 120 is not currently performing the MBIST for the first rank of the memory device 120. In some implementations, the memory device 120 may set the first DMI bit to the second value based on writing the test status to the test status mode register 410. In this case, example operations performed by the memory device 120 may include determining that the MBIST is enabled (based on the value of test control mode register 420), determining to perform the MBIST for the first rank of the memory device 120, setting the first DMI bit to the first value, performing the MBIST for the first rank of the memory device 120 based on setting the first DMI bit to the first value, completing the MBIST for the first rank of the memory device 120 (and optionally writing a result of the MBIST to the test status mode register 410), and setting the first DMI bit to the second value based on completing the MBIST for the first rank of the memory device 120.

As shown by reference number 855, the host device 110 may read the test status from the test status mode register 410 (e.g., from a set of bits and/or the test status field 520), such as by issuing an MRR command, to the memory device 120, that identifies the test status mode register 410. The host device 110 may determine the test status or the one or more tested memory sections 440 based on reading the test status mode register 410.

As shown by reference number 860, the host device 110 may perform one or more actions based on the test status. For example, the host device 110 may issue one or more commands to the memory device 120 (e.g., to perform additional MBIST testing or to perform a PPR procedure), may update data stored by the host device 110 to control future commands associated with MBIST testing, and/or may take corrective action (e.g., disabling use of the memory device 120, outputting an alert, or the like).

For example, the host device 110 may issue one or more commands to the memory device 120 based on the test status, and the memory device 120 may be configured to receive the one or more commands from the host device 110 based on the test status. For example, if the test status indicates that a repairable failure exists, then the host device 110 may issue a command to perform a PPR procedure (e.g., by writing an appropriate value to the test control field 610 of the test control mode register 420). As another example, the host device 110 may issue a command to perform MBIST on another memory section 440 (e.g., by writing appropriate values to test control mode register 420 and/or the section identifier mode register 430). As another example, the host device 110 may write to the test control mode register 420 to disable MBIST (e.g., by writing a value of "00" to the test control field 610) after reading the test status mode register 410 and/or after determining that MBIST has been performed.

As another example, the host device 110 may take a corrective action, such as by disabling use of the memory device 120 if the test status indicates that MBIST is unreliable for the memory device 120. Additionally, or alternatively, the host device 110 may transfer data to another memory device 120 and/or output a notification to alert the system 100 and/or a user of the system 100 of the failure of the memory device 120.

As another example, the host device 110 may update a section indicator stored by the host device 110. In some implementations, the host device 110 may update the section indicator based on a determination that MBIST has been completed for the one or more memory sections 440 that the host device 110 instructed the memory device 120 to test (e.g., based on a test status indicating no failure, repair success, existence of a repairable failure, and/or existence of an unrepairable failure). As shown in FIG. 8B, in example 800, the section indicator has been updated from section 0 to section 1. In this case, in a next instruction to perform MBIST, the host device may write a value of "10111111" to the section identifier mode register (based on the stored section indicator) to instruct the memory device 120 to test section 1.

As described above, in some implementations, the host device 110 is configured to update (e.g., increment) the section indicator based on an indication that MBIST has been performed for the one or more memory sections indicated by the host device 110. Additionally, or alternatively, the host device 110 may update the section indicator periodically, such as once per hour, once per day, once per week, or the like. Additionally, or alternatively, the host device 110 may update the section indicator based on expiration of a timer, which may be configurable and/or may be stored by the host device 110. Additionally, or alternatively, the host device 110 may update the section indicator based on detecting an event associated with the system 100 (e.g., an automobile) and/or the memory device 120, such as powering up of the system 100 and/or the memory device 120, an instruction to power down the system 100 and/or the memory device 120, or the like.

In some implementations, a DMI bit associated with a DMI pin of the memory device 120 may be used to indicate whether a data mask inversion function is to be applied to data associated with a standard memory operation. However, the information that is indicated by the DMI bit may not be useful during the MBIST procedure. In some implementations, the memory device 120 may have multiple DMI bits (and associated DMI pins). A first DMI bit may correspond to a first memory portion (e.g., a lower memory portion) and a second DMI bit may correspond to a second memory portion (e.g., an upper memory portion that is electrically stacked on the lower memory portion). However, the memory device 120 may only be able to perform an MBIST for a single memory portion (e.g., the lower memory portion or the upper memory portion) at a given time. Using the techniques described herein, the memory device 120 may be configured to use a first DMI bit to indicate a status of an MBIST for a first memory portion of the memory device 120 and to use a second DMI bit to indicate a status of an MBIST for a second memory portion of the memory device 120. A first value (e.g., "0") for the first DMI bit may indicate that the memory device 120 is performing the MBIST for the first rank of the memory device 120, and a second value (e.g., "1") for the first DMI bit may indicate that the memory device 120 is not performing the MBIST for the first rank of the memory device 120. In contrast, the first value (e.g., "0") for the second DMI bit may indicate that the memory device 120 is not performing the MBIST for the second rank of the memory device 120, while the second value (e.g., "1") for the second DMI bit may indicate that the memory device 120 is performing the MBIST for the second rank of the memory device 120. By using different DMI bits and different DMI bit values to indicate the MBIST status, the memory device 120 may be able to perform an MBIST for the first rank of the memory device and the second rank of the memory device simultaneously. This may improve the performance and reliability of the memory device while reducing the number of bits that are needed to indicate and determine the status of the MBIST.

As indicated above, FIGS. 8A-8B are provided as examples. Other examples may differ from what is described with regard to FIGS. 8A-8B.

FIGS. 9A-9B are diagrams of an example 900 of a process flow for performing a memory built-in self-test. The process flow of FIGS. 9A-9B may be performed by the host device 110 and/or the memory device 120. The process flow of FIGS. 9A-9B may be used to perform MBIST on one or more memory sections 440.

As shown in FIG. 9A, at the start of the MBIST procedure, the host device 110 may enable MBIST with on-die ECC enabled (shown as Path "10"), or may enable MBIST with on-die ECC disabled (shown as Path "01"). When on-die ECC is enabled, MBIST will test and identify rows that have an MBE, while SBEs will be masked by the on-die ECC. The host device 110 may then initiate a repair procedure (e.g., MBIST-MPPR) for the memory device 120 in which the memory device 120 repairs those MBEs. The host device 110 may then use the memory device 120 with SBEs being corrected or masked by on-die ECC (or may initiate MBIST with on-die ECC disabled to repair SBEs). When on-die ECC is disabled, MBIST will test and identify rows that have an SBE, and can then repair those rows (e.g., if MBEs were not detected after performing MBIST with on-die ECC enabled).

As shown by process step 902, if the host device 110 determines to enable MBIST with on-die ECC enabled, then the host device 110 may write a value of "10" to the test control field 610 of mode register (MR) 118 (e.g., the test control mode register 420), such as by using an MRW command. In some implementations, the host device 110 may write this value after reading MR119 (e.g., the test status mode register 410) to determine that MBIST is supported. The memory device 120 (e.g., the controller 130) may read the value of "10" from MR118. In some implementations, the host device 110 may write a value of 0 to all other bits of MR118 (e.g., other than the test control field 610).

In some implementations, the host device 110 may write to one or more mode registers to control the MBIST procedure. For example, the host device 110 may write to MR117 to control the specific memory section(s) 440 to which the MBIST procedure (and/or a repair procedure) is to be applied. The MBIST procedure (and/or repair procedure) described herein may be performed on the specific memory section(s) 440. In some implementations, the host device 110 may write to MR117 after writing to MR118 (e.g., at process step 902 and/or process step 920) and/or before issuing one or more commands for a guard key sequence (e.g., at process step 904 and/or process step 922).

As shown by process step 904, the host device 110 may issue one or more commands for a guard key sequence. During the guard key sequence, the memory device 120 does not perform MBIST. The MBIST procedure starts after the guard key sequence. Prior to starting MBIST, a control signal, such as a DMI signal (or a byte of the DMI signal, such as a lower byte), of the memory device 120 may be driven high, and may remain high until MBIST completes. As shown by process step 906, the control signal (e.g., the DMI signal) may be driven from high to low after MBIST completes. As shown by process step 908, after MBIST completes, the host device 110 may issue an MRW command to write a value of "00" to the test control field 610 of MR118 to disable MBIST. As shown by process step 910, the control signal (e.g., the DMI signal) may be driven to high-z (e.g., where the control signal is turned off or allowed to float), which places the memory device 120 in a standard or normal operating mode (e.g., not a testing mode). As described in more detail below, the control signal may be received via a control pin, such as a DMI pin, and the control signal may be driven from one state to another state by the memory device 120 and/or the host device 110. For example, either the memory device 120, the host device 110, or both the memory device 120 and the host device 110 may be configured to drive the control signal (e.g., the DMI bit) from one state to another state.

As shown by process step 912, the host device 110 may issue an MRR command to read the test status field 520 of MR119. As shown by process step 914, if the value of the test status field 520 is "11" or otherwise indicates that MBIST is unreliable and/or the memory device 120 should not be used (or has a device error), then the host device 110 may issue a reset command to the memory device 120 and/or may refrain from using the memory device 120. As shown by process step 916, if the value of the test status field 520 is "10" or otherwise indicates that an unrepairable failure exists (e.g., due to insufficient spare rows and/or columns to repair all errors, such as MBEs), then the host device 110 may either use the memory device 120 or refrain from using the memory device 120 based on a configuration of the host device. For example, the host device 110 may use the memory device 120 despite known faults, may perform diagnostics, may identify the memory rows and/or columns with errors, and/or may retire (e.g., stop using) those rows and/or columns.

As shown by process step 918, if the value of the test status field 520 is "01" or otherwise indicates that a repairable failure exists, then the host device 110 may issue a command to repair the failure (e.g., using PPR, MBIST-PPR, or the like). As shown by process step 920, the host device 110 may issue an MRW command to write a value of "11" to the test control field 610 of MR118 to enable the repair. As shown by process step 922, the host device 110 may issue one or more commands for a guard key sequence. During the guard key sequence, the memory device 120 does not perform the repair. The repair procedure starts after the guard key sequence. Prior to starting the repair procedure, the control signal (e.g., the DMI signal) may be driven high, and may remain high until the repair procedure completes. As shown by process step 924, the control signal (e.g., the DMI signal) may be driven from high to low after the repair procedure completes. As shown by process step 926, after the repair procedure completes, the host device 110 may issue an MRW command to write a value of "00" to the test control field 610 of MR118 to disable MBIST (and/or a repair). As shown by process step 928, the control signal (e.g., the DMI signal) may be driven to high-z (e.g., where the control signal is turned off or allowed to float), which places the memory device 120 in a standard or normal operating mode (e.g., not a testing mode).

As shown by process step 930, after the repair procedure is complete, the host device 110 may either (e.g., based on a configuration) perform the process steps 902 through 912 again (and one of process steps 914, 916, 918, or 934, depending on a test status at process step 912) or issue an MRR command to read the test status field 520 of MR119, as shown by process step 932. If the value of the test status field 520 is "01" or otherwise indicates that repairable failures exist, then the host device 110 may perform the process steps 902 through 912 again (and one of process steps 914, 916, 918, or 934, depending on a test status at process step 912). If the value of the test status field 520 is "00" or otherwise indicates that no failure was detected, then the host device 110 may proceed to process step 934.

As shown by process step 934, if MR119 indicates (e.g., at process step 912 or process step 932) that no failure was detected, then the host device 110 may optionally (e.g., based on a configuration) test for SBEs. If the host device 110 determines not to test for SBEs (e.g., because the memory device 120 has on-die ECC enabled to correct SBEs or the host device 110 has already tested for SBEs), then the host device 110 may proceed to use the memory device 120, which is operating without MBEs (e.g., and correcting SBEs using ECC). If the host device 110 determines to test for SBEs, then the host device 110 may enable MBIST with on-die ECC disabled (shown as Path "01"), described below in connection with FIG. 9B.

As shown in FIG. 9B, and by process step 936, if the host device 110 determines to enable MBIST with on-die ECC disabled, then the host device 110 may issue an MRW command to write a value of "01" to MR118. In some implementations, the host device 110 may write this value after reading MR119 to determine that MBIST is supported. The memory device 120 (e.g., the controller 130) may read the value of "01" from MR118. In some implementations, the host device 110 may write a value of to all other bits of MR118 (e.g., other than the test control field 610).

In some implementations, the host device 110 may write to one or more mode registers to control the MBIST procedure. For example, the host device 110 may write to MR117 to control the specific memory section(s) 440 to which the MBIST procedure (and/or a repair procedure) is to be applied. The MBIST procedure (and/or repair procedure) described herein may be performed on the specific memory section(s) 440. In some implementations, the host device 110 may write to MR117 after writing to MR118 (e.g., at process step 936 and/or process step 954) and/or before issuing one or more commands for a guard key sequence (e.g., at process step 938 and/or process step 956).

As shown by process step 938, the host device 110 may issue one or more commands for a guard key sequence. During the guard key sequence, the memory device 120 does not perform MBIST. The MBIST procedure starts after the guard key sequence. Prior to starting MBIST, a control signal (e.g., the DMI signal) may be driven high, and may remain high until MBIST completes. As shown by process step 940, the control signal (e.g., the DMI signal) may be driven from high to low after MBIST completes. As shown by process step 942, after MBIST completes, the host device 110 may issue an MRW command to write a value of "00" to the test control field 610 of MR118 to disable MBIST. As shown by process step 944, the control signal (e.g., the DMI signal) may be driven to high-z (e.g., where the control signal is turned off or allowed to float), which places the memory device 120 in a standard or normal operating mode (e.g., not a testing mode).

As shown by process step 946, the host device 110 may issue an MRR command to read the test status field 520 of MR119. As shown by process step 948, if the value of the test status field 520 is "11" or otherwise indicates that MBIST is unreliable and/or the memory device 120 should not be used (or has a device error), then the host device 110 may issue a reset command to the memory device 120 and/or may refrain from using the memory device 120. As shown by process step 950, if the value of the test status field 520 is "10" or otherwise indicates that an unrepairable failure exists (e.g., due to insufficient spare rows and/or columns to repair all errors, such as MBEs), then the host device 110 may determine whether the memory device 120 has tested for MBEs (e.g., using Path "01" to enable MBIST with on-die ECC enabled). If the memory device 120 has tested for MBEs, then the host device 110 may use the memory device 120 with an assumption that one or more SBEs exist (and can be corrected using ECC). If the memory device 120 has not tested for MBEs and/or has not performed MBIST with on-die ECC enabled, then the host device 110 may enable MBIST with on-die ECC enabled (shown as Path "10"), as described above in connection with FIG. 9A (e.g., may proceed with process step 902).

As shown by process step 952, if the value of the test status field 520 is "01" or otherwise indicates that a repairable failure exists, then the host device 110 may issue a command to repair the failure (e.g., using PPR, MBIST-PPR, or the like). As shown by process step 954, the host device 110 may issue an MRW command to write a value of "11" to the test control field 610 of MR118 to enable the repair. As shown by process step 956, the host device 110 may issue one or more commands for a guard key sequence. During the guard key sequence, the memory device 120 does not perform the repair. The repair procedure starts after the guard key sequence. Prior to starting the repair procedure, the control signal (e.g., the DMI signal) may be driven high, and may remain high until the repair procedure completes. As shown by process step 958, the control signal (e.g., the DMI signal) may be driven from high to low after the repair procedure completes. As shown by process step 960, after the repair procedure completes, the host device 110 may issue an MRW command to write a value of "00" to the test control field 610 of MR118 to disable MBIST (and/or a repair). As shown by process step 962, the control signal (e.g., the DMI signal) may be driven to high-z (e.g., where the control signal is turned off or allowed to float), which places the memory device 120 in a standard or normal operating mode (e.g., not a testing mode).

As shown by process step 964, after the repair procedure is complete, the host device 110 may either (e.g., based on a configuration) perform the process steps 936 through 946 again (and one of process steps 948, 950, 952, or 968, depending on a test status at process step 946) or issue an MRR command to read the test status field 520 of MR119, as shown by process step 966. If the value of the test status field 520 is "01" or otherwise indicates that repairable failures exist, then the host device 110 may perform the process steps 936 through 946 again (and one of process steps 948, 950, 952, or 968, depending on a test status at process step 946). If the value of the test status field 520 is "00" or otherwise indicates that no failure was detected, then the host device 110 may proceed to process step 968.

As shown by process step 968, if MR119 indicates (e.g., at process step 946 or process step 966) that no failure was detected, then the host device 110 may proceed to use the memory device 120, which is operating without MBEs and without SBEs.

Although the description of FIGS. 9A-9B starts with Path "10" and optionally proceeds to Path "01," in some implementations, the host device 110 may start with Path "01," as shown in FIG. 9A As indicated above, FIGS. 9A-9B are provided as examples. Other examples may differ from what is described with regard to FIGS. 9A-9B.

FIG. 10 is an example timing diagram 1000 associated with performing a memory built-in self-test. The timing diagram shows example signals transmitted by the host device 110 and received by the memory device 120 to control MBIST operations. The timing diagram of FIG. 10 may be used to perform MBIST on one or more memory sections 440.

The timings of various input signals are shown in FIG. 10 with reference to a differential clock signal, shown using a first clock signal (CK_t) and a second clock signal (CK_c). The input signals shown in FIG. 10 are sampled on the crossing of the positive (rising) edge of the first clock signal and the negative (falling) edge of the second clock signal. The chip select (CS) signal is used to control whether the memory device 120 reads input signals and/or applies those input signals.

As shown, at time T0, the memory device 120 may receive a valid (V) command and address (CA) signal issued by the host device 110, and the memory device 120 may receive an MRW command (Cmd) signal issued by the host device 110. The MRW command may be used to write an entry to a mode register, such as MR118, to signal the memory device 120 to monitor for a guard key sequence to trigger MBIST. In FIG. 10, an MRW command is shown as two separate MRW commands, MRW1 and MRW2. Two MRW commands may be required to write to a mode register, such as if there are only seven CA inputs and thirteen values plus a command code are required to write to a mode register.

At time Ta0, the memory device 120 may receive a valid CA signal issued by the host device 110 and a first MRW command signal (shown as MRW1 and MRW2) issued by the host device 110. The first MRW command signal may be a first sequence of a four-part guard key sequence that is written to a mode register, such as MR42. Similarly, the memory device 120 may receive a second MRW command signal at time Tb0 (a second sequence of the four-part guard key sequence), the memory device 120 may receive a third MRW command signal at time Tc0 (a third sequence of the four-part guard key sequence), and the memory device 120 may receive a fourth MRW command signal at time Td0 (a fourth sequence of the four-part guard key sequence). The memory device 120 may validate each of these mode register entries prior to performing MBIST, and may only perform MBIST if the mode register entries are validated. As shown, each MRW command may be separated by the mode register command cycle time (tMRD).

At time Te0, if the four-part guard key sequence is valid, then the memory device 120 may perform MBIST. In some implementations, the host device 110 may issue continuous deselect (DES) command signals until MBIST is complete or disabled. Additionally, or alternatively, the DMI signal may be high during MBIST, and may be driven low after MBIST is complete.

As described herein, the DMI bit (e.g., the DMI signal) may be used to indicate a data mask inversion operation to be applied to data during a standard memory operation of the memory device 120. In some implementations, the memory device 120 may be configured to perform the standard memory operation when the test control mode register 420 indicates that MBIST is disabled (e.g., when the one or more bits of the test control mode register 420 indicate "00"). In some implementations, the DMI bit may be a bi-directional signal that is used to indicate data that is to be masked and/or data that is to be inverted on a bus corresponding to the DMI pin. For data bus inversion (DBI), the DMI bit may be driven high when the data on the bus is to be inverted, and may be driven low when the data is in a normal state. For data masking (DM), the DMI bit may be used in combination with the data lines to indicate data to be masked in a mask write command. As described herein, the DMI bit may be associated with a DMI pin of the memory device 120. In some implementations, the memory device may include multiple DMI pins. As shown in Table 2, the DMI bit may indicate one or more functions to be applied to the standard memory operation of the memory device 120 based on the MBIST being disabled by the host device 110.

TABLE 2

| | | DMI Pin | | | |
|---|---|---|---|---|---|
| | | Pin Function Write/Read | | | |
| | DBI | Link Protection Disabled | | Link Protection Enabled | |
| Pin Name | Enabled | Write | Read | Write | Read |
| DMI | No | DM | N/A | DM | Parity |
| | Yes | DMI | DBI | DMI | Parity |

As shown in Table 2, for a write operation when DBI is disabled and link protection is disabled, the memory device 120 and/or the host device 110 may be configured to apply a data masking function to the data. For a write operation when DBI is disabled and link protection is enabled, the memory device 120 and/or the host device 110 may be configured to apply a data masking function to the data. For a read operation when DBI is disabled and link protection is enabled, the memory device 120 and/or the host device 110 may be configured to read the one or more bits as parity bits (and therefore, may ignore the data indicated by the one or more bits). For a write operation when DBI is enabled and link protection is disabled, the memory device 120 and/or the host device 110 may be configured to apply a data mask inversion function to the data. For a read operation when DBI is enabled and link protection is disabled, the memory device 120 and/or the host device 110 may be configured to interpret the one or more bits in accordance with the DBI function. For a write operation when DBI is enabled and link protection is enabled, the memory device 120 and/or the host device 110 may be configured to apply a data mask inversion function to the data. For a read operation when DBI is enabled and link protection is enabled, the memory device 120 and/or the host device 110 may be configured to interpret the one or more bits in accordance with the DBI function.

In some implementations, the DMI bit may be used to indicate a status of the MBIST when the MBIST is enabled by the host device 110. As described herein, the memory device 120 may be configured to perform an MBIST when the test control mode register 420 indicates that MBIST is enabled. For example, the memory device 120 may be configured to perform an MBIST when the test control mode register indicates that MBIST is enabled with on-die ECC disabled (e.g., when the one or more bits of the test control mode register 420 indicate "01") or when the test control mode register 420 indicates that MBIST is enabled with on-die ECC enabled (e.g., when the one or more bits of the test control mode register 420 indicate "10"). When the host device 110 indicates that the MBIST is enabled, and when the memory device 120 determines to perform the MBIST for the first rank of the memory device 120, the memory device 120 may set the first DMI bit to the first value. Additionally, or alternatively, when the host device 110 indicates that the MBIST is enabled, and when the memory device 120 determines to perform the MBIST for the second rank of the memory device 120, the memory device 120 may set the second DMI bit to the second value. When the MBIST is completed for the first rank of the memory device 120, the memory device 120 may set the first DMI bit to the second value to indicate that the memory device 120 is no longer (e.g., not currently) performing the MBIST. Similarly, when the MBIST is completed for the second rank of the memory device 120, the memory device 120 may set the second DMI bit to the first value to indicate that the memory device 120 is no longer (e.g., not currently) performing the MBIST. The host device 110 may be configured to change the one or more bits of the test control mode register 420 to "00" to disable the MBIST at the memory device 120 based on the first DMI bit being set to the second value and the second DMI bit being set to the first value. In some implementations, the host device 110 may not be able to interrupt or disable the MBIST while the memory device 120 is currently performing the MBIST, such as when the first bit is set to "1" to indicate that the memory device 120 is currently performing the MBIST for the first rank of the memory device or when the second bit is set to "0" to indicate that the memory device 120 is currently performing the MBIST for the second rank of the memory device. While the example of FIG. 10 shows a single DMI pin, the memory device 120 may include multiple DMI pins (as described herein). For example, the memory device 120 may include a first DMI pin that is associated with a first memory portion (e.g., a lower memory portion) of the memory device 120 and a second DMI pin that is associated with a second memory portion (e.g., an upper memory portion) of the memory device 120.

In some implementations, the memory device 120 may drive the DMI signal to high prior to beginning MBIST, and may drive the DMI signal to low after completing MBIST. The host device 110 may monitor the DMI signal (e.g., via the DMI pin). The host device 110 may determine that MBIST is in progress when the DMI signal is high, and may determine that MBIST has completed when the DMI signal is low. In some implementations, the memory device 120 may write a test status to the test status mode register 410 prior to the DMI signal being driven low. Based on the DMI signal being driven low, the host device 110 may disable MBIST by writing to the test control mode register 420. This may trigger the memory device 120 to float the DMI signal and enter a normal or standard operating mode. After disabling MBIST and when the DMI signal is floating (e.g., in high-z), the host device 110 may issue an MRR command to read the test status mode register 410, and the host device 110 and the memory device 120 may operate as described above in connection with FIGS. 9A-9B based on the test status.

As described herein, the DMI signal may be used to indicate a data mask inversion function to be applied to a standard memory operation of the memory device 120 when the MBIST is disabled by the host device 110. In contrast, the DMI signal may be used to indicate a status of the MBIST being performed by the memory device 120 (for one or more ranks of the memory device 120) when the MBIST is enabled by the host device 110. Although the control signal is described herein as the DMI signal, other control signals may be used. For example, any control signal capable of being communicated between the memory device 120 and/or the host device 110 may be used to indicate a status of the MBIST being performed by the memory device 120 when the MBIST is enabled by the host device 110.

As indicated above, FIG. 10 is provided as an example. Other examples may differ from what is described with regard to FIG. 10.

FIG. 11 is a flowchart of an example method 1100 associated with indicating a status of a memory built-in self-test for multiple memory device ranks. In some implementations, a memory device (e.g., memory device 120) may perform or may be configured to perform one or more process blocks of FIG. 11. In some implementations, another device or a group of devices separate from or including the memory device (e.g., the system 100 and/or the host device 110) may perform or may be configured to perform one or more process blocks of FIG. 11. Additionally, or alternatively, one or more components of the memory device (e.g., the controller 130 and/or the testing component 270) may perform or may be configured to perform one or more process blocks of FIG. 11.

As shown in FIG. 11, the method 1100 may include reading one or more bits, associated with a memory built-in self-test, that are stored in a mode register of the memory device (block 1110). As further shown in FIG. 11, the method 1100 may include identifying a first DMI bit of the memory device that is associated with a first rank of the memory device and a second DMI bit of the memory device that is associated with a second rank of the memory device (block 1120). As further shown in FIG. 11, the method 1100 may include setting the first DMI bit to a first value based on the one or more bits indicating that the memory built-in self-test is enabled and based on determining to perform the memory built-in self-test for the first rank of the memory device (block 1130). The first value may indicate that the memory built-in self-test is being performed for the first rank of the memory device when the first DMI bit is set to the first value and that the memory built-in self-test is not being performed for the second rank of the memory device when the second DMI bit is set to the first value. A second value may indicate that the memory built-in self-test is not being performed for the first rank of the memory device when the first DMI bit is set to the second value and that the memory built-in self-test is being performed for the second rank of the memory device when the second DMI bit is set to the second value. As further shown in FIG. 11, the method 1100 may include performing the memory built-in self-test for the first rank of the memory device based on setting the first DMI bit to the first value (block 1140).

Although FIG. 11 shows example blocks of a method 1100, in some implementations, the method 1100 may include additional blocks, fewer blocks, different blocks, or differently arranged blocks than those depicted in FIG. 11. Additionally, or alternatively, two or more of the blocks of the method 1100 may be performed in parallel. The method 1100 is an example of one method that may be performed by one or more devices described herein. These one or more devices may perform or may be configured to perform one or more other methods based on operations described herein, such as the operations described in connection with FIGS. 4-10.

In some implementations, a memory device includes one or more components configured to: read one or more bits, associated with a memory built-in self-test, that are stored in a mode register of the memory device; identify a first DMI bit of the memory device that is associated with a first rank of the memory device and a second DMI bit of the memory device that is associated with a second rank of the memory device; set the first DMI bit to a first value based on the one or more bits indicating that the memory built-in self-test is enabled and based on determining to perform the memory built-in self-test for the first rank of the memory device, wherein the first value indicates that the memory built-in self-test is being performed for the first rank of the memory device when the first DMI bit is set to the first value and indicates that the memory built-in self-test is not being performed for the second rank of the memory device when the second DMI bit is set to the first value, and wherein a second value indicates that the memory built-in self-test is not being performed for the first rank of the memory device when the first DMI bit is set to the second value and indicates that the memory built-in self-test is being performed for the second rank of the memory device when the second DMI bit is set to the second value; and perform the memory built-in self-test for the first rank of the memory device based on setting the first DMI bit to the first value.

In some implementations, a system includes a memory device configured to: read one or more bits, associated with a memory built-in self-test, that are stored in a mode register of the memory device; identify a first DMI bit of the memory device that is associated with a first rank of the memory device and a second DMI bit of the memory device that is associated with a second rank of the memory device; set the first DMI bit to a first value based on the one or more bits indicating that the memory built-in self-test is enabled and based on determining to perform the memory built-in self-test for the first rank of the memory device, wherein the first value indicates that the memory built-in self-test is being performed for the first rank of the memory device when the first DMI bit is set to the first value and indicates that the memory built-in self-test is not being performed for the second rank of the memory device when the second DMI bit is set to the first value, and wherein a second value indicates that the memory built-in self-test is not being performed for the first rank of the memory device when the first DMI bit is set to the second value and indicates that the memory built-in self-test is being performed for the second rank of the memory device when the second DMI bit is set to the second value; and perform the memory built-in self-test for the first rank of the memory device based on setting the first DMI bit to the first value; and a host device configured to: write to the one or more bits, that are stored in the mode register of the memory device, to indicate that the memory built-in self-test is enabled; and identify, based on the first DMI bit of the memory device having the first value or the second value, whether the memory device is currently performing the memory built-in self-test or is not currently performing the memory built-in self-test for the first rank of the memory device.

In some implementations, a method comprising: reading one or more bits, associated with a memory built-in self-test, that are stored in a mode register of a memory device; identifying a first control signal bit of the memory device that is associated with a first rank of the memory device and a second control signal bit of the memory device that is associated with a second rank of the memory device; setting the first control signal bit to a first value based on the one or more bits indicating that the memory built-in self-test is enabled and based on determining to perform the memory built-in self-test for the first rank of the memory device, wherein the first value indicates that the memory built-in self-test is being performed for the first rank of the memory device when the first control signal bit is set to the first value and indicates that the memory built-in self-test is not being performed for the second rank of the memory device when the second control signal bit is set to the first value, and wherein a second value indicates that the memory built-in self-test is not being performed for the first rank of the memory device when the first control signal bit is set to the second value and indicates that the memory built-in self-test is being performed for the second rank of the memory device when the second control signal bit is set to the second value; initiating the memory built-in self-test for the first rank of the memory device based on setting the first control signal bit to the first value; completing the memory built-in self-test for the first rank of the memory device; and setting the first control signal bit to the second value based on completing the memory built-in self-test for the first rank of the memory device.

The foregoing disclosure provides illustration and description but is not intended to be exhaustive or to limit the implementations to the precise forms disclosed. Modifications and variations may be made in light of the above disclosure or may be acquired from practice of the implementations described herein.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
one or more components configured to:
read one or more bits, associated with a memory built-in self-test, that are stored in a mode register of the memory device;
identify a first data mask inversion (DMI) bit of the memory device that is associated with a first rank of the memory device and a second DMI bit of the memory device that is associated with a second rank of the memory device;
set the first DMI bit to a first value based on the one or more bits indicating that the memory built-in self-test is enabled and based on determining to perform the memory built-in self-test for the first rank of the memory device,
wherein the first value indicates that the memory built-in self-test is being performed for the first rank of the memory device when the first DMI bit is set to the first value and indicates that the memory built-in self-test is not being performed for the second rank of the memory device when the second DMI bit is set to the first value, and wherein a second value indicates that the memory built-in self-test is not being performed for the first rank of the memory device when the first DMI bit is set to the second value and indicates that the memory built-in self-test is being performed for the second rank of the memory device when the second DMI bit is set to the second value; and
perform the memory built-in self-test for the first rank of the memory device based on setting the first DMI bit to the first value.

2. The memory device of claim 1, wherein the first DMI bit is associated with a first DMI pin of the memory device and the second DMI bit is associated with a second DMI pin of the memory device.

3. The memory device of claim 1, wherein the first rank of the memory device corresponds to a lower memory portion of the memory device and the second rank of the memory device corresponds to an upper memory portion of the memory device.

4. The memory device of claim 1, wherein the one or more components are further configured to:
set the second DMI bit to the second value based on the one or more bits indicating that the memory built-in self-test is enabled and based on determining to perform the memory built-in self-test for the second rank of the memory device; and
perform the memory built-in self-test for the second rank of the memory device based on setting the second DMI bit to the second value.

5. The memory device of claim 4, wherein the one or more components, to perform the memory built-in self-test for the second rank of the memory device, are configured to perform at least a portion of the memory built-in self-test for the second rank of the memory device while performing the memory built-in self-test for the first rank of the memory device.

6. The memory device of claim 1, wherein the first DMI bit is in a float state when the memory built-in self-test is not being performed for the first rank of the memory device and the second DMI bit is in a float state when the memory built-in self-test is not being performed for the second rank of the memory device.

7. The memory device of claim 1, wherein the one or more components, to set the first DMI bit to the first value, are configured to:
set the first DMI bit to the first value based on a configuration of the memory device;
set the first DMI bit to the first value using an auto-sensing operation; or
set the first DMI bit to the first value using a pull-up operation or a pull-down operation.

8. The memory device of claim 1, wherein the first DMI bit indicates a status of a data masking function or a data inversion function for the first rank of the memory device, and the second DMI bit indicates a status of the data masking function or the data inversion function for the second rank of the memory device, while the memory built-in self-test is disabled.

9. The memory device of claim 1, wherein the one or more components are further configured to:
complete the memory built-in self-test for the first rank of the memory device; and
set the first DMI bit to the second value based on completing the memory built-in self-test.

10. The memory device of claim 1, wherein the one or more components, to perform the memory built-in self-test for the first rank of the memory device, are configured to perform the memory built-in self-test for one or more memory sections, but fewer than all memory sections, of a plurality of memory sections associated with the first rank of the memory device.

11. The memory device of claim 1, wherein a first value of the one or more bits indicates that the memory built-in self-test is to be disabled, a second value of the one or more bits indicates that the memory built-in self-test is enabled with on-die error-correcting code disabled, a third value of the one or more bits indicates that the memory built-in self-test is enabled with on-die error-correcting code enabled, and a fourth value of the one or more bits indicates that a repair mode of the memory device is enabled.

12. A system, comprising:
a memory device configured to:
read one or more bits, associated with a memory built-in self-test, that are stored in a mode register of the memory device;
identify a first data mask inversion (DMI) bit of the memory device that is associated with a first rank of the memory device and a second DMI bit of the memory device that is associated with a second rank of the memory device;
set the first DMI bit to a first value based on the one or more bits indicating that the memory built-in self-test is enabled and based on determining to perform the memory built-in self-test for the first rank of the memory device,
wherein the first value indicates that the memory built-in self-test is being performed for the first rank of the memory device when the first DMI bit is set to the first value and indicates that the memory built-in self-test is not being performed for the second rank of the memory device when the second DMI bit is set to the first value, and wherein a second value indicates that the memory built-in self-test is not being performed for the first rank of the memory device when the first DMI bit is set to the second value and indicates that the memory built-in self-test is being performed for the second rank of the memory device when the second DMI bit is set to the second value; and perform the memory built-in self-test for the first rank of the memory device based on setting the first DMI bit to the first value; and a host device configured to:

write to the one or more bits, that are stored in the mode register of the memory device, to indicate that the memory built-in self-test is enabled; and identify, based on the first DMI bit of the memory device having the first value or the second value, whether the memory device is currently performing the memory built-in self-test or is not currently performing the memory built-in self-test for the first rank of the memory device.

13. The system of claim 12, wherein the first rank of the memory device corresponds to a lower memory portion of the memory device and the second rank of the memory device corresponds to an upper memory portion of the memory device.

14. The system of claim 12, wherein the memory device is further configured to:

set the second DMI bit to the second value based on the one or more bits indicating that the memory built-in self-test is enabled and based on determining to perform the memory built-in self-test for the second rank of the memory device; and perform the memory built-in self-test for the second rank of the memory device based on setting the second DMI bit to the second value, wherein performing the memory built-in self-test for the second rank of the memory device comprises performing at least a portion of the memory built-in self-test for the second rank of the memory device while performing the memory built-in self-test for the first rank of the memory device.

15. The system of claim 12, wherein the first DMI bit is in a float state when the memory built-in self-test is not being performed for the first rank of the memory device and the second DMI bit is in a float state when the memory built-in self-test is not being performed for the second rank of the memory device.

16. The system of claim 15, wherein the memory device, to perform the memory built-in self-test for the second rank of the memory device, is configured to perform at least a portion of the memory built-in self-test for the second rank of the memory device while performing the memory built-in self-test for the first rank of the memory device.

17. The system of claim 12, wherein the memory device, to set the first DMI bit to the first value, is configured to:

set the first DMI bit to the first value based on a configuration of the memory device;

set the first DMI bit to the first value using an auto-sensing operation; or set the first DMI bit to the first value using a pull-up operation or a pull-down operation.

18. The system of claim 12, wherein the first DMI bit indicates a status of a data masking function or a data inversion function for the first rank of the memory device, and the second DMI bit indicates a status of the data masking function or the data inversion function for the second rank of the memory device, while the memory built-in self-test is disabled.

19. The system of claim 12, wherein the memory device is further configured to:

complete the memory built-in self-test for the first rank of the memory device; and set the first DMI bit to the second value based on completing the memory built-in self-test.

20. The system of claim 12, wherein the memory device, to perform the memory built-in self-test for the first rank of the memory device, is configured to perform the memory built-in self-test for one or more memory sections, but fewer than all memory sections, of a plurality of memory sections associated with the first rank of the memory device.

21. A method comprising:

reading one or more bits, associated with a memory built-in self-test, that are stored in a mode register of a memory device;

identifying a first control signal bit of the memory device that is associated with a first rank of the memory device and a second control signal bit of the memory device that is associated with a second rank of the memory device;

setting the first control signal bit to a first value based on the one or more bits indicating that the memory built-in self-test is enabled and based on determining to perform the memory built-in self-test for the first rank of the memory device, wherein the first value indicates that the memory built-in self-test is being performed for the first rank of the memory device when the first control signal bit is set to the first value and indicates that the memory built-in self-test is not being performed for the second rank of the memory device when the second control signal bit is set to the first value, and wherein a second value indicates that the memory built-in self-test is not being performed for the first rank of the memory device when the first control signal bit is set to the second value and indicates that the memory built-in self-test is being performed for the second rank of the memory device when the second control signal bit is set to the second value;

initiating the memory built-in self-test for the first rank of the memory device based on setting the first control signal bit to the first value;

completing the memory built-in self-test for the first rank of the memory device; and setting the first control signal bit to the second value based on completing the memory built-in self-test for the first rank of the memory device.

22. The method of claim 21, wherein the first control signal bit is associated with a first data mask inversion (DMI) pin of the memory device and the second control signal bit is associated with a second DMI pin of the memory device.

23. The method of claim 21, wherein the first rank of the memory device corresponds to a lower memory portion of the memory device and the second rank of the memory device corresponds to an upper memory portion of the memory device.

24. The method of claim 21, further comprising:

setting the second control signal bit to the second value based on the one or more bits indicating that the memory built-in self-test is enabled and based on determining to perform the memory built-in self-test for the second rank of the memory device; and initiating the memory built-in self-test for the second rank of the memory device based on setting the second control signal bit to the second value.

25. The method of claim 24, further comprising performing at least a portion of the memory built-in self-test for the second rank of the memory device while performing the memory built-in self-test for the first rank of the memory device.

* * * * *